(12) United States Patent
Tao et al.

(10) Patent No.: US 11,929,444 B2
(45) Date of Patent: Mar. 12, 2024

(54) FUNCTIONAL PART, PHOTOVOLTAIC MODULE AND METHOD FOR MANUFACTURING PHOTOVOLTAIC MODULE

(71) Applicants: Jinko Green Energy (Shanghai) Management Co., LTD, Shanghai (CN); ZHEJIANG JINKO SOLAR CO., LTD, Haining (CN)

(72) Inventors: Wusong Tao, Shanghai (CN); Tao Xu, Shanghai (CN); Luchuang Wang, Shanghai (CN); Zhiqiu Guo, Shanghai (CN); Hao Jin, Shanghai (CN)

(73) Assignees: JINKO GREEN ENERGY (SHANGHAI) MANAGEMENT CO., LTD, Shanghai (CN); ZHEJIANG JINKO SOLAR CO., LTD, Zhejiang (CN)

( * ) Notice: Subject to any disclaimer, the term of this patent is extended or adjusted under 35 U.S.C. 154(b) by 187 days.

(21) Appl. No.: 17/008,521

(22) Filed: Aug. 31, 2020

(65) Prior Publication Data

US 2021/0391484 A1    Dec. 16, 2021

(30) Foreign Application Priority Data

Jun. 16, 2020  (CN) .......................... 202010550351.5
Jun. 16, 2020  (CN) .......................... 202010550354.9

(51) Int. Cl.
*H01L 31/05*    (2014.01)
*H01L 31/049*   (2014.01)
*H01L 31/18*    (2006.01)

(52) U.S. Cl.
CPC ........ *H01L 31/0508* (2013.01); *H01L 31/049* (2014.12); *H01L 31/186* (2013.01)

(58) Field of Classification Search
CPC .............. H01L 31/048–0516; Y02E 10/50–56
See application file for complete search history.

(56) References Cited

U.S. PATENT DOCUMENTS

2015/0064831 A1   3/2015  Furihata et al.
2019/0296171 A1   9/2019  Chang et al.

FOREIGN PATENT DOCUMENTS

CN    101677112 A    3/2010
CN    102034892 B    7/2012
(Continued)

OTHER PUBLICATIONS

Jinko Green Energy (Shanghai) Management Co., Ltd et al., Extended European Search Report, EP 20193546.7, dated Feb. 16, 2021, 9 pgs.

(Continued)

*Primary Examiner* — Jayne L Mershon

(57) ABSTRACT

The present disclosure provides a functional part, a photovoltaic module and a method of manufacturing photovoltaic modules. The functional part is configured to form a photovoltaic module with a cell string that includes a plurality of cells. Adjacent cells of share an overlapped region. The functional part has a first surface facing the cell string and a second surface opposite to the first surface. The functional part includes at least one groove extending from the first surface toward the second surface. A location of each groove corresponds to a location of at least one overlapped region.

11 Claims, 16 Drawing Sheets

(56) References Cited

FOREIGN PATENT DOCUMENTS

| | | |
|---|---|---|
| CN | 202454590 U | 9/2012 |
| CN | 204257671 U | 4/2015 |
| CN | 104619492 A | 5/2015 |
| CN | 204834644 U | 12/2015 |
| CN | 207199642 U | 4/2018 |
| CN | 207602592 U | 7/2018 |
| CN | 208240699 U | 12/2018 |
| CN | 208527158 U | 2/2019 |
| CN | 209119137 U | 7/2019 |
| CN | 110085694 A | 8/2019 |
| CN | 110235257 A | 9/2019 |
| CN | 209434202 U | 9/2019 |
| CN | 209487524 U | 10/2019 |
| CN | 209544366 U | 10/2019 |
| CN | 209658213 U | 11/2019 |
| CN | 110600563 A | 12/2019 |
| CN | 209729925 U | 12/2019 |
| CN | 210073887 U | 2/2020 |
| CN | 210628329 U | 5/2020 |
| CN | 210640261 U | 5/2020 |
| DE | 102018112104 A1 | 11/2019 |
| JP | 2002185027 A | 6/2002 |
| JP | 2005072567 A | 3/2005 |
| JP | 2014154628 A * | 8/2014 |
| JP | 2019004135 A | 1/2019 |
| JP | 2019519942 A | 7/2019 |
| WO | 2018087008 A1 | 5/2018 |

OTHER PUBLICATIONS

Jinko Green Energy (Shanghai) Management Co., Ltd et al., JP First Office Action, JP 2021-042003, dated Jun. 24, 2021, 2 pgs.
Jinko Green Energy (Shanghai) Management Co., Ltd., et al., CN First Office Action with English Translation, CN 202010550351.5, dated Dec. 3, 2021, 14 pgs.
Jinko Green Energy (Shanghai) Management Co., Ltd., et al., CN First Office Action with English Translation, CN 202010550354.9, dated Dec. 31, 2021, 16 pgs.
Jinko Green Energy (Shanghai) Management Co., Ltd, et al., AU First Office Action, AU Application No. 2020226978, dated Mar. 12, 2021, 8 pgs.

* cited by examiner

FUNCTIONAL PART, PHOTOVOLTAIC MODULE AND METHOD FOR MANUFACTURING PHOTOVOLTAIC MODULE

CROSS REFERENCE TO RELATED APPLICATIONS

This application claims the benefit of priority to Chinese Patent Application No. 2020105503515, titled "COVER PLATE AND PHOTOVOLTAIC MODULE," filed Jun. 16, 2020, and Chinese patent application No. 2020105503549, titled "ADHESIVE FILM, PHOTOVOLTAIC MODULE AND MANUFACTURING METHOD," filed on Jun. 16, 2020, each of which is incorporated herein by reference in its entirety.

TECHNICAL FIELD

The present disclosure relates to solar cell technology, in particular, to a functional part, a photovoltaic module and a method for manufacturing a photovoltaic module.

BACKGROUND

As problems of energy shortage, global warming and environmental deterioration are getting more and more serious, solar energy gains increasing attention as a green and renewable energy source. A photovoltaic module is a device that converts renewable solar energy into electrical energy.

Module efficiency is an important index to indicate performance of a photovoltaic module. The index directly reflects efficiency of the photovoltaic module's use of light energy. Specifically, high module efficiency facilitates reduction of not only cost of manufacturing a photovoltaic module, but also area of real estate dedicated to the operation of a power station. In addition, to achieve the same module power, a photovoltaic module with higher efficiency has a smaller size and correspondingly, a lower weight.

Improving the module efficiency of photovoltaic modules, however, often results in lower yield of the photovoltaic modules.

SUMMARY

An objective of the present disclosure is to provide a functional part, a photovoltaic module and a method for manufacturing photovoltaic modules to solve the problem of low yield of photovoltaic modules.

Some embodiments of the present disclosure provide a functional part configured to form a photovoltaic module with a cell string. The cell string includes a plurality of cells, where adjacent cells shares an overlapped region. The functional part has a first surface facing the cell string and a second surface opposite to the first surface. The functional part includes at least one groove extending from the first surface toward the second surface. A position of each groove faces or corresponds to a position of at least one overlapped region.

Some embodiments of the present disclosure further provide a photovoltaic module including the functional part of the above embodiments.

Some embodiments of the present disclosure further provide a method for manufacturing a photovoltaic module, which includes: stacking up in sequence a first cover plate, a first adhesive film, a cell string, a second adhesive film and a second cover plate, where at least one of the first adhesive film and the second adhesive film is the above functional part, the cell string includes a plurality of cells, adjacent cells share an overlapped region, and a position of each groove facing a position of at least one overlapped region; laminating, the first cover plate, the first adhesive film, the cell string, the second adhesive film and the second cover plate, to form a laminated photovoltaic module. Compared with existing technologies, according to the embodiments of the present disclosure, a functional part has a first surface and a second surface opposite to each other, the first surface has a central region and a peripheral region, and at least one groove extends from the first surface toward the second surface. At least a portion of at least one groove is located at the peripheral region, and a position of each groove facing a position of at least one overlapped region. In a laminating stage, when the functional part is used to produce a photovoltaic module, each groove may buffer a laminating pressure on the overlapped region of cells, thereby reducing a risk of cracking and fragmenting of the overlapped region, which is advantageous for improving module efficiency of the photovoltaic module while improving yield of the photovoltaic module.

In the method for manufacturing a photovoltaic module in the embodiments of the present disclosure, the adhesive film is advantageous for improving yield of the photovoltaic module and the groove plays a role of positioning the cell, thereby reducing the difficulty of manufacturing the photovoltaic module.

In some embodiments, the functional part includes an adhesive film. The adhesive film is configured to encapsulate the cell string in the photovoltaic module.

In some embodiments, each groove crosses a plurality of overlapped regions.

In some embodiments, the adjacent cells have a connecting line in the overlapped region, and a length direction of the at least one groove is identical with the extending direction of the connecting line.

In some embodiments, the first surface includes a central region and a peripheral region located at an outer side of the central region, at least a portion of the at least one groove is located in the peripheral region and a position of each groove faces or corresponds to a position of at least one overlapped region. In addition, the first surface includes the central region and the peripheral region where the groove is located. The groove is configured to buffer a laminating pressure on the overlapped region of cells in the peripheral region, thereby reducing a risk of cracking and fragmenting of the overlapped region, which is advantageous for improving yield of the photovoltaic module.

In some embodiments, the functional part includes a cover plate. The cover plate is configured to form the photovoltaic module with the cell string. The first surface includes a central region and a peripheral region located at an outer side of the central region. At least a portion of the at least one groove is located in the peripheral region and a position of each groove faces a position of at least one overlapped region.

In some embodiments, when a portion of the at least one groove is located in the peripheral region, another portion of the at least one groove is further located in the central region. Each groove facing a respective overlapped region located in the peripheral region has a first capacity. Each groove facing a respective overlapped region located in the central region has a second capacity. The first capacity is larger than the second capacity. In this way, the overlapped regions in both the central region and the peripheral region can be prevented from cracking or fragmenting. Besides, since the groove in the central region is smaller so that there is sufficient amount of adhesive film with the groove, a good encapsulation with the adhesive can be ensured, thereby further improving the yield and service life of the photovoltaic module.

In some embodiments, in a direction parallel to an arrangement direction of the plurality of cells in one cell string, a cross section area of the at least one groove in the peripheral region is larger than a cross section area of the at least one groove in the central region.

In some embodiments, a depth of the at least one groove in the peripheral region is larger than a depth of the at least one groove in the central region; or in a direction parallel to an arrangement direction of the plurality of cells in one cell string, a cross section width of the at least one groove in the peripheral region is larger than a cross section width of the at least one groove in the central region.

In some embodiments, the at least one groove crosses the peripheral region and the central region, or a portion of the at least one groove located in the peripheral region and another portion of the at least one groove located in the central region are separated.

In some embodiments, in the direction parallel to the arrangement direction of the plurality of cells in one cell string, a cross section shape of the at least one groove in the peripheral region is different from a cross section shape of the at least one groove in the central region.

In some embodiments, the first surface has a rectangle shape, both the central region and the peripheral region cross a short side of the first surface, and the peripheral regions are separately located at two opposite sides of the central region; or the first surface has a square shape or a circle shape, and the peripheral region surrounds the central region.

In some embodiments, the cover plate is a glass cover plate, a polymer cover plate or a stainless-steel cover plate.

In some embodiments, the depth of the at least one groove is smaller than or equal to half a thickness of the functional part.

In some embodiments, in the direction parallel to the arrangement direction of the plurality of cells in one cell string, a cross section shape of the at least one groove is an arc, an inverted trapezoid, a square or an inverted triangle.

In some embodiments, the functional part further includes a plurality of protruding structures on a surface of the at least one groove.

In some embodiments, a photovoltaic module includes at least one cover plate. The at least one cover plate is the functional part in any of the above embodiments. The photovoltaic module further includes: a cell string, including a plurality of cells, where adjacent cells share an overlapped region, and a position of each groove facing a position of at least one overlapped region; and an adhesive film, located between the cover plate and the cell string, and in the groove.

In some embodiments, the at least one cover plate is configured as a back plate, and the photovoltaic module further includes a transparent front plate located at one side of the cell string, the side being away from the back plate. Or the at least one cover plate is configured as a transparent front plate, and the photovoltaic module further includes a back plate located at one side of the cell string, the side being away from the transparent front plate.

In some embodiments, the at least one cover plate includes a back plate and a transparent front plate. The back plate and the transparent front plate are separately located at two opposite sides of the cell string, and each overlapped region faces or corresponds to the at least one groove in the back plate and/or the at least one groove in the transparent front plate.

In some embodiments, the at least one groove in the back plate and the at least one groove in the transparent front plate face each other in terms of position; or the at least one groove in the back plate and the at least one groove in the transparent front plate are staggered in terms of position.

In some embodiments, in the method manufacturing for the photovoltaic module, the first adhesive film is the functional part in any of the above embodiments. The first adhesive film includes at least one groove. The second adhesive film is the functional part in any of the above embodiments. The second adhesive film includes at least one groove. And in stacking-up stage, the at least one groove in the second adhesive film and the at least one groove in the first adhesive film face each other in terms of position; or the at least one groove in the second adhesive film and the at least one groove in the first adhesive film are staggered in terms of position.

In some embodiments, the second adhesive film is the functional part in any of the above embodiments, the second adhesive film includes at least one groove. In the laminating stage, a surface of the second cover plate is pressed, the surface being away from the second adhesive film.

In some embodiments, the adhesive film with the groove is formed through a calender roll having a protruding structure.

BRIEF DESCRIPTION OF THE DRAWINGS

One or more embodiments are described as examples with reference to the corresponding figures in the accompanying drawings, and the embodiments do not constitute a limitation to the embodiments. Elements with the same reference numerals in the accompanying drawings represent the similar elements. The figures in the accompanying drawings do not constitute a proportion limitation unless otherwise stated. The accompanying embodiments are divided for convenience of description and shall not constitute any limitation on the specific implementation of the present disclosure. The accompanying embodiments may be combined and referenced mutually on the premise of no contradiction.

DETAILED DESCRIPTION

In order to improve efficiency of a photovoltaic module, stitch welding may be applied to remove a gap between cells. That is, in a cell string of the photovoltaic module, adjacent cells share an overlapped region, and the overlapped region has both adjacent cells overlapped and a welding ribbon for electrically connecting the adjacent cells. During production of photovoltaic modules, in a laminating stage, an overlapped region has a higher risk of cracking and fragmenting under a laminating pressure, thereby affecting yield of photovoltaic modules produced.

In order to address the above issue, embodiments of the present disclosure provide a functional part. The functional part is configured to form a photovoltaic module with a cell string. The functional part includes a groove to buffer a pressure on the overlapped region during manufacturing the photovoltaic module, thereby improving yield of photovoltaic modules.

In order to clarify the objective, the technical solutions and the advantages of the embodiments of the present disclosure, the embodiments of the present disclosure will be described in detail with reference to the drawings. However, those ordinary skilled in the art may appreciate that in the embodiments of the present disclosure, in order for readers to understand the present disclosure more easily, multiple technical details are provided. However, without the technical details and variations and amendments to the embodiments as stated in the following, the technical solutions that the present disclosure claims to protect can still be realized.

Figure 1:
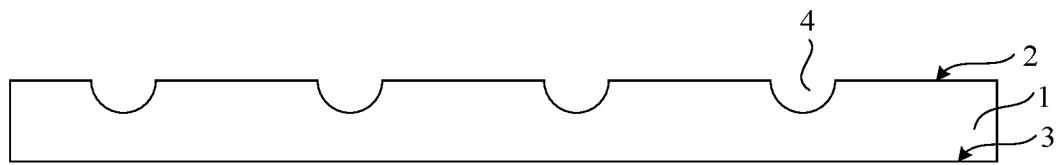
FIG. 1 is a schematic diagram showing a structure of a functional part provided in a first embodiment of the present disclosure.

FIG. 1 is a schematic diagram showing a structure of a functional part provided in a first embodiment of the present disclosure.

With reference to FIG. 1, in this embodiment, a functional part 1 is configured to form a photovoltaic module with a cell string that includes a plurality of cells, the adjacent cells share an overlapped region, the cover plate has a first surface 2 facing the cell string and a second surface 3 opposite to the first surface 2, grooves 4 extending from the first surface 2 to the second surface 3. A position of each groove 4 faces or corresponds to a position of at least one overlapped region.

The functional part 1 may either be an adhesive film configured to encapsulate the cell string, or a cover plate configured to form the photovoltaic module with the cell string. The grooves 4 enable the laminating pressure on the overlapped region during the production of the photovoltaic module to be buffered, thereby reducing a risk of cracking or fragmenting of the overlapped region and improving yield of photovoltaic modules.

In a direction parallel to an arrangement direction of the plurality of cells in one cell string, a cross section shape of the groove 4 may be an arc, an inverted trapezoid, a square or an inverted triangle.

A depth of the groove 4 is smaller than or equal to half a thickness of the functional part 1. In this way, the strength of the functional part 1 is further improved when the laminating pressure on the overlapped region is buffered, so that the functional part 1 is able to protect the cell string, and the reliability of the photovoltaic module is further improved.

Figure 2:
FIGS. 2 to 5 are schematic diagrams showing a structure of an adhesive film provided in a second embodiment of the present disclosure.
Figure 3:
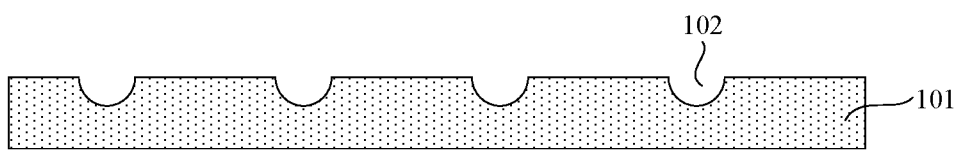
Figure 4:
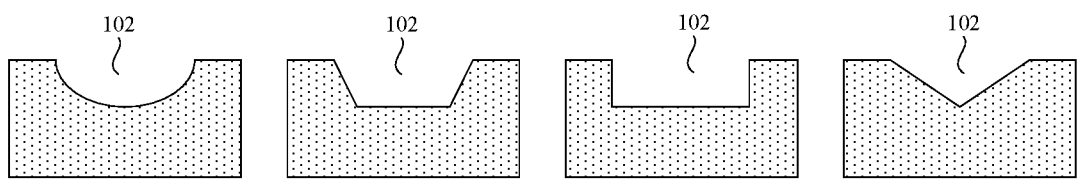
Figure 5:
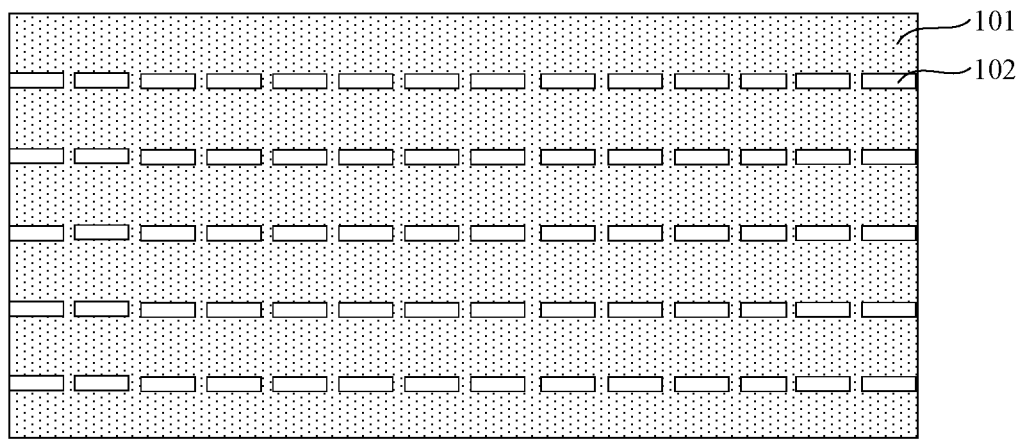

A second embodiment of the present disclosure also provides a functional part. The functional part may be an adhesive film. FIGS. 2 to 5 are schematic diagrams showing a structure of an adhesive film provided in a second embodiment of the present disclosure. FIG. 2 is a schematic diagram showing a top-view structure of an adhesive film. FIG. 3 is a schematic diagram showing a cross section structure along AA1 in FIG. 2. FIG. 4 is a schematic diagram showing different cross section structures of a groove. FIG. 5 is another schematic diagram showing a top-view structure of an adhesive film.

Referring to FIGS. 2 to 4, the adhesive film 101 is configured to encapsulate the cell string in the photovoltaic module. The cell string includes a plurality of cells. Adjacent cells share an overlapped region. The adhesive film 101 has a first surface facing the cell string and a second surface opposite to the first surface, at least one groove 102 extending from the first surface toward the second surface. A position of each groove 102 faces a position of at least one overlapped region.

The adhesive film 101 may be an EVA adhesive film or a POE adhesive film. The adhesive film 101 may be a coiled material or a sheet material.

In this embodiment, the first surface is a rectangle. One groove 102 crosses the long side of the first surface, and a plurality of overlapped regions. The adjacent cells in the cell string have a connecting line in the overlapped region. In an extending direction of the connecting line, one groove 102 crosses multiple overlapped regions. When forming the photovoltaic module, one groove 102 may face an overlapped region of at least two cell strings, which helps to reduce the quantity of the groove 102, reduce the difficulty of manufacturing the adhesive film 101 and the cost of production. The direction of the connecting line is perpendicular to an arrangement direction of the multiple cells in one cell string. The extending direction of one groove 102 is identical with the extending direction of the connecting line, which is shared in the overlapped region by the adjacent cells of one cell string. The length direction of the groove 102 is identical with the extending direction of the connecting line.

An arrangement direction of grooves 102 is related to an arrangement location of the cell string. In this embodiment, one groove 102 extends horizontally, different grooves 102 are arranged separately in a vertical direction. "Horizontally" refers to a direction of the long side of the first surface, while "vertical" refers to a direction of the short side of the first surface. When forming the photovoltaic module, cells are arranged as follows: cells in one cell string are arranged vertically, and an extending direction of the connecting line in an overlapped region in one cell string is horizontal. The adhesive film 101 may be applicable to cell strings without gaps or cell strings with gaps.

In other embodiments, referring to FIG. 5, in the extending direction of the connecting line, which is in the overlapped region of the adjacent cells in one cell string, the adhesive film 101 may have two separated grooves, and a distance between adjacent grooves 102 is the same as a distance between cell strings, that is, adhesive film 101 may be applicable to the cell strings with gaps. Since a plurality of grooves 102 are separated from each other, different grooves 102 may be provided with different sizes. In this way, it is advantageous for matching cell strings of different sizes and improving structural flexibility of the photovoltaic module. Compared with the solution that adjacent grooves are in connection, in the extending direction of the connecting line, there is a material of the adhesive film 101 between the adjacent grooves 102, and the material can improve mechanical strength of the adhesive film 101 while thickness of the adhesive film 101 keeps unchanged, thereby ensuring a good encapsulation of the adhesive film 101 in the process of manufacturing the photovoltaic modules.

A position of the groove 102 faces a position of the overlapped region, and a distance between adjacent grooves 102 matches the size of cells. The larger the size of the cells, the larger the distance between the adjacent grooves 102; the smaller the size of the cells, the smaller the distance between the adjacent grooves 102. In this embodiment, the adjacent grooves 102 are arranged with an equal distance. In other embodiments, distances between adjacent grooves may vary. The size of the cells may be 150 mm to 250 mm.

In this embodiment, in a direction parallel to the arrangement direction of the plurality of cells in one cell string, i.e., in a cross section direction perpendicular to the connecting line, a cross section width of the groove 102 is 5 mm to 20 mm, for example, 6 mm, 10 mm, 12 mm, 15 mm and 18 mm.

Referring to FIG. 3, in this embodiment, in a direction to the arrangement direction of the plurality of cells in one cell string, i.e., in a cross section direction perpendicular to the connecting line, a cross section shape of the groove 102 may be an arc. In other embodiments, in the direction parallel to the arrangement direction of the plurality of cells in one cell string, the cross section shape of the groove may be an inverted trapezoid, a square or an inverted triangle.

In the direction parallel to the arrangement direction of the adjacent cells in one cell string, a width of the groove 102 is larger than or equal to a width of the overlapped region, which is advantageous for ensuring that pressures on regions of the overlapped region are comparatively small, thereby further reducing the risk of cracking and fragmenting of the overlapped region. An orthographic projection of the overlapped region on the first surface is a first projection, an orthographic projection of the groove 102 on the first surface is a second projection, and in the direction parallel to the arrangement direction of the plurality of cells in one cell string, a boundary of the first projection and a boundary of the second projection are overlapped, or the boundary of the first projection is located within the boundary of the second projection.

A depth of the groove 102 is smaller than or equal to half a thickness of the adhesive film 101. In this way, the depth of the groove 102 takes an appropriate rate of a thickness of the adhesive film 101, so that the adhesive film 101 of the region where the groove 102 is located still has a moderate thickness, thereby ensuring a good encapsulation effect of the region where the groove 102 is located. The depth of the groove 102 may further be larger than ⅙ the thickness of the adhesive film 101. For example, the depth of the groove 102 is ⅓, ¼ or ⅕ the thickness of the adhesive film 101. In this way, the groove 102 has sufficient capacity, which is advantageous for improving the groove 102's ability of relieving or removing pressure.

Referring to FIG. 4, the adhesive film 101 may further include a plurality of protruding structures 112 on a surface of the groove 102. A shape of the protruding structures 112 may be triangular prisms or hemispheres. The protruding structures are advantageous for further buffering a pressure on the overlapped region in the laminating stage, and are advantageous for increasing a contact area between the adhesive film 101 and the cover plate, thereby strengthening sealing strength between the cover plate and the adhesive film 101.

In addition, the adhesive film 101 may further include: a burring structure 113 located between the adjacent grooves. A shape of the burring structure 113 may be a triangular prism or a hemisphere. A size of the burring structure 113 is smaller than a size of a protruding structure 112. The arrangement of the burring structure 113 is advantageous not only for increasing friction between the adhesive film 101 and the cover plate during the stacking-up stage, but also for buffering laminating pressure on the adhesive film 101, thereby further improving yield of photovoltaic modules.

The adhesive film 101 provided in this embodiment may be manufactured through a calender roll having a periodically protruding structure. When the adhesive film passes the calender roll having a periodically protruding structure, the adhesive film 101 in the contact portion with the protruding structure is pressed out to form the periodic grooves 102.

During production of the photovoltaic module, the groove 102 faces the overlapped region of the cell string. Since the arrangement of the groove 102, there is a gap between the adhesive film 101 and the overlapping region before the lamination stage. During a laminating process, a pressure on the adhesive film 101 is reduced or removed after passing through the groove 102, thereby greatly reducing a risk of cracking or fragmenting of the overlapped region.

Figure 6:
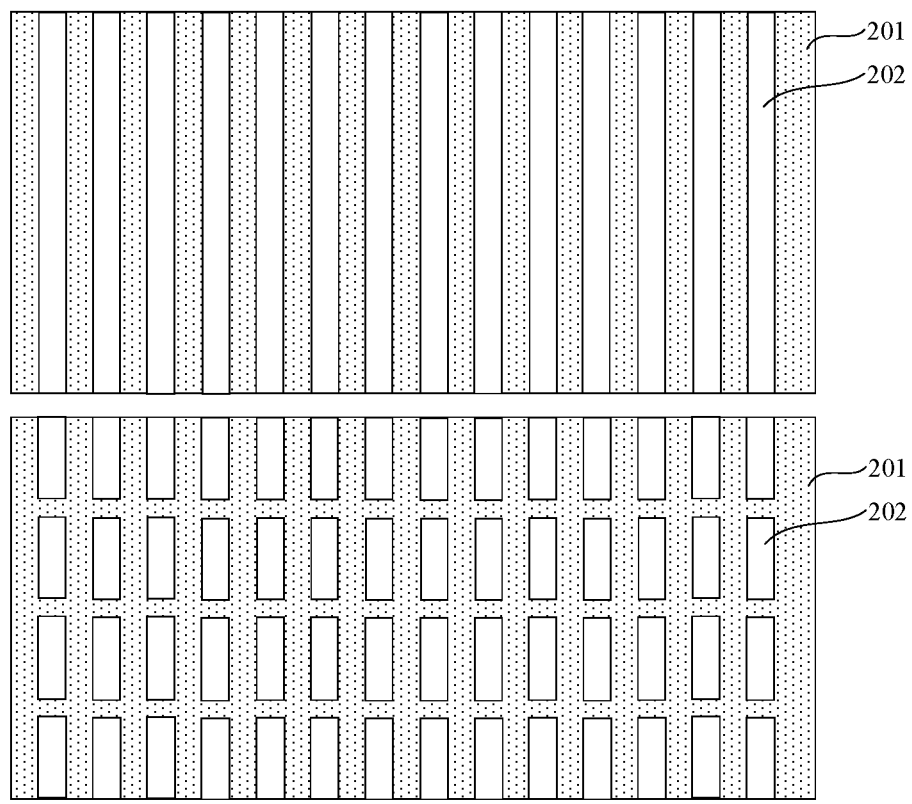
FIG. 6 is a schematic diagram showing a top-view structure of an adhesive film provided in a third embodiment of the present disclosure.

A third embodiment of the present disclosure further provides an adhesive film that is largely identical with the previous embodiment. Main differences include that one groove in the third embodiment extends vertically and different grooves are arranged separately in a horizontal direction. FIG. 6 is a schematic diagram showing a top-view structure of the adhesive film provided in the third embodiment of the present disclosure. The adhesive film provided in the third embodiment of the present disclosure is described in detail in the following with reference to the drawings.

Referring to FIG. 6, an adhesive film 201 includes a first surface facing the cell string, a second surface opposite to the first surface, at least one groove 202 extending from the first surface toward the second surface. A position of each groove 202 faces a position of at least one overlapped region. Herein, the first surface includes a long side and a short side perpendicular to each other. The long side extends horizontally and the short side extends vertically. One groove 202 extends vertically. Different grooves 202 are arranged separately in a horizontal direction.

When forming the photovoltaic module, cells are arranged as follows: cells in one cell string are arranged horizontally, and an extending direction of the connecting line in an overlapped region in one cell string is vertical. In one embodiment, referring to the upper figure in FIG. 6, one groove 202 crosses the adhesive film 201 vertically in the entire width range. The adhesive film 201 may be applicable to cell strings without gaps or cell strings with gaps. In another embodiment, referring to the lower figure in FIG. 6, a plurality of separate grooves 202 are provided vertically. A distance between adjacent grooves 202 is the same as a distance between cell strings. The adhesive film 201 may be applicable to cell strings with gaps.

The adjacent grooves 201 may be arranged with an equal distance in the horizontal direction. Or, distances between adjacent grooves 201 may vary.

Figure 7:
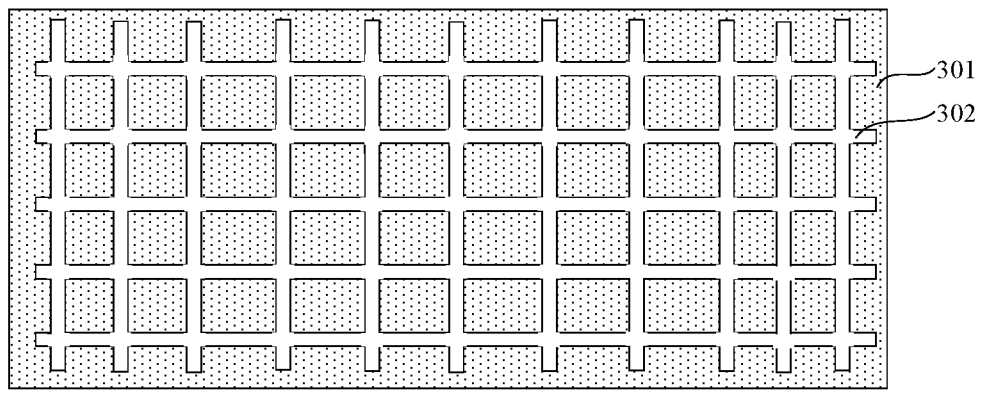
FIG. 7 is a schematic diagram showing a top-view structure of an of adhesive film provided in a fourth embodiment of the present disclosure.

A fourth embodiment of the present disclosure also provides an adhesive film. A main difference lies that the grooves includes a plurality of grooves extending horizontally and a plurality of grooves extending vertically. FIG. 7 is a schematic top-view structure of the adhesive film provided in the fourth embodiment. The adhesive film provided in the fourth embodiment of the present disclosure is described in detail in the following with reference to the drawings. Contents identical with or corresponding to the previous embodiments may be seen in the above.

With reference to FIG. 7, an adhesive film 301 includes a first surface, a second surface and grooves 302 extending from the first surface toward the second surface. The grooves 302 includes a plurality of grooves 302 extending along a long side of the first surface and a plurality of grooves 302 extending along a short side of the first surface.

The grooves 302 include a plurality of grooves 302 extending horizontally (along a long side of the first surface) and a plurality of grooves 302 extending vertically (along a short side of the first surface). Cell strings include a first cell string where cells are arranged vertically and a second cell string where cells are arranged horizontally.

The adhesive film 301 provided in this embodiment may form a photovoltaic module with a cell string where cells are arranged horizontally and a cell string where cells are arranged vertically.

A fifth embodiment of the present disclosure provides an adhesive film including a central region and a peripheral region located at an outer side of the central region. Main differences from the previous embodiments include that grooves are located in the peripheral region and a positon of each groove faces a position of at least one overlapped region. The adhesive film provided in the fifth embodiment of the present disclosure is described in detail in the following with reference to the drawings.

Figure 8:
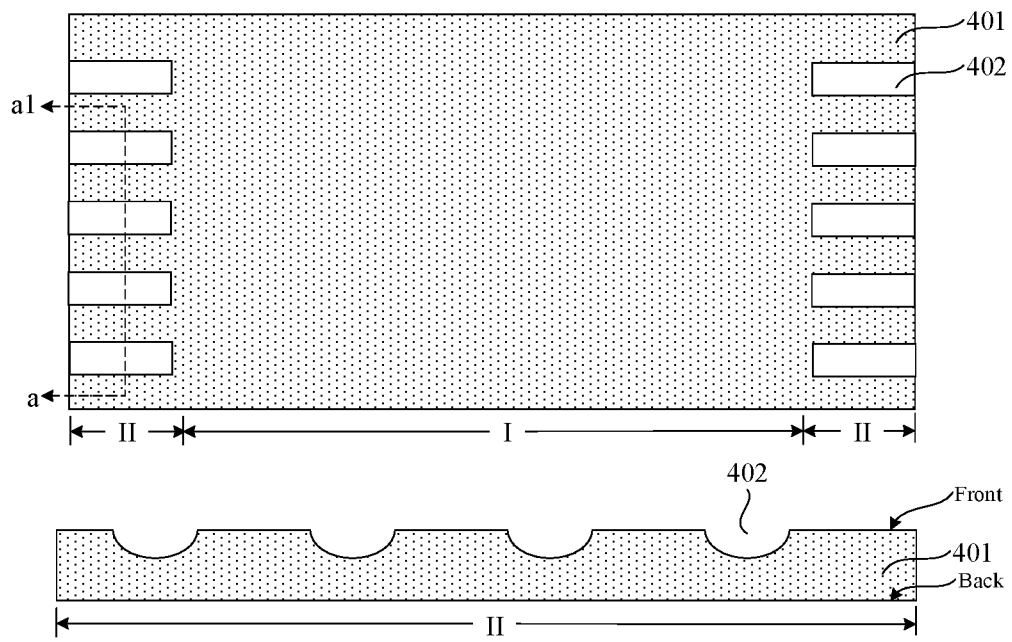
FIG. 8 is a schematic diagram showing a structure of an adhesive film provided in a fifth embodiment of the present disclosure.

FIG. 8 is a schematic diagram showing a structure of an adhesive film provided in a fifth embodiment of the present disclosure. In FIG. 8, an upper figure is a top-view structure diagram, a lower figure is a cross-section-view structure diagram along an aa1 cutting line.

With reference to FIG. 8, an adhesive film 401 is configured to encapsulate the cell string in the photovoltaic module. The cell string includes a plurality of cells. Adjacent cells share an overlapped region. The adhesive film 401 has a first surface Front facing the cell string and a second surface Back opposite to the first surface, at least one groove 402 extending from the first surface toward the second surface. A position of each groove 402 faces a position of at least one overlapped region.

Inventors of the present disclosure find that a photovoltaic module has a central region I and a peripheral region II located at an outer side of the central region, and the risk of cracking and fragmenting in the overlapped region is higher at the peripheral region than at the central region.

A further analysis shows that reasons for this problem include: steps of manufacturing a photovoltaic module include a stacking-up stage and a laminating stage. In the stacking-up stage, a back plate, a lower adhesive film, a cell string, an upper adhesive film and a front plate in order form an overlapped structure. In the laminating stage, an air extraction process is performed first to remove air between layers of the overlapped structure, and a pressure treatment is performed after the air extraction process. During or after the air extraction process, the peripheral region warps upwards, and the upward warping of the peripheral region is increased by a heating process to some extent when the heating process is performed during or after the air extraction process. In order to remove upward warping, during the laminating stage, a pressure applied to the peripheral region may be higher than a pressure applied to the central region, which, however, may cause a higher risk of cracking and fragmenting to the overlapped region in the peripheral region. Alternatively, in order to remove the upward warping of the peripheral region, even if the pressure applied to the peripheral region during the laminating stage is identical with the pressure applied to the central region, there is a higher risk of cracking or fragmenting of the overlapped region in the peripheral region than in the central region, due to a deformation of the front plate and back plate in the peripheral region being greater than a deformation of the front plate and back plate in the central region in the laminating stage.

The peripheral region II may be located at two opposite sides of the central region I. Alternatively, the peripheral region II may surround the central region I.

A width of the peripheral region II may be a width across at least one cell string. In this way, when forming the photovoltaic module, the peripheral region II faces at least one cell string. Alternatively, the width of the peripheral region II may be 1/N a width of a single cell string, N being larger than 1. In this way, when forming the photovoltaic module, the peripheral region II faces 1/N the cell string. Alternatively, the width of the peripheral region II may be a width of n cell strings and 1/N the width of the single cell string, n being a natural number larger than or equal to 1. In this way, when forming the photovoltaic module, the peripheral region II faces n+1/N the cell string. Herein, the width described above refers to a width in a direction perpendicular to an arrangement direction of a plurality of cells in one cell string.

The width of the peripheral region II may be related to a size of the Front. The width of the peripheral region II may be reasonably set in accordance with the size of the Front. The larger the size of the Front, the more area of the peripheral region II having the problem of upward warping, and the larger width the peripheral region II. The smaller the size of the Front, the smaller area having the problem of upward warping, and correspondingly, the smaller width the peripheral region II.

It shall be noted that a location relationship between the peripheral region II and the central region I is related to a shape of the Front. For example, in this embodiment, the shape of the Front is a rectangle, both the central region I and the peripheral regions II may across a short side of the Front and may be arranged along a long side of the Front, and the peripheral regions II is separately located at the two opposite sides of the central region I. In other embodiments, the shape of the first surface is a rectangle or a circle, and the peripheral region surrounds the central region.

In this embodiment, in the direction of the long side of the first surface Front, the width of the peripheral region II is 10 mm to 20 mm, for example, 12 mm, 15 mm or 17 mm.

In other embodiments, the shape of the first surface may further be a triangle, a trapezoid, a regular polygon or an irregular shape. A region where upward warping easily occurs may be reasonably predicted in accordance with the shape of the first surface, and correspondingly, the region where upward warping easily occurs is the peripheral region. For example, if the shape of the first surface is a triangle, the peripheral region is located in a region where three angles of the first surface are located, and the first surface has one central region and three peripheral regions.

Since the peripheral region II has grooves 402, during a laminating process of using the adhesive film 401 to produce the photovoltaic module, a gap between the adhesive film 401 and the overlapped region causes a pressure on the overlapped region facing the adhesive film 401 to be reduced or removed, thereby greatly reducing a risk of cracking or fragmenting of the overlapped region in the peripheral region II, and improving yield of photovoltaic modules. In addition, in a laminating stage, an adhesive film at the grooves 402 is melt under heat and fills the groove 402, so a flow region of the adhesive film is increased, thereby reducing pressure applied to the overlapped region by the adhesive film, which may also promote yield of the photovoltaic modules to some extent.

An extending direction of one groove 402 is the same as an extending direction of a connecting line of the adjacent cells in one cell string in the overlapped region. In other words, the extending direction of one groove 402 is perpendicular to the arrangement direction of the plurality of cells in one cell string. That is to say, an arrangement direction of grooves is related to an arrangement location of the cell string. In this embodiment, one groove 402 extends horizontally, different grooves 402 are arranged separately in a vertical direction. "Horizontally" refers to a direction of the long side of the first surface, while "vertical" refers to a direction of the short side of the first surface. When forming the photovoltaic module, cells are arranged in the peripheral region II as follows: cells in one cell string are arranged vertically, and an extending direction of the connecting line in an overlapped region in one cell string is horizontal. In other embodiments, one groove may further extend vertically, and different grooves are separately arranged in a horizontal direction. When the photovoltaic module is formed, an arrangement of cells in the peripheral region is: cells in one cell string are arranged horizontally and the extending direction of the connecting line in the overlapped region in one cell string is vertical. In yet another example, the grooves includes a first groove extending horizontally and a second groove extending vertically. A cell string includes a first cell string where cells are arranged vertically and a second cell string where cells are arranged horizontally.

Further, in this embodiment, in the extending direction of the connecting line, which is in the overlapped region of the adjacent cells in one cell string, i.e., in a direction perpendicular to the arrangement direction of the plurality of cells in one cell string, in the peripheral region II each groove 402 may either face one overlapped region of one cell string or face an overlapped region of at least two cell strings. That is, the adhesive film 401 may be applicable to cell strings without gaps or cell strings with gaps. In other embodiments, in the extending direction of the connecting line of the adjacent cells in one cell string in the overlapped region, one peripheral region may further have at least two grooves, and a distance between adjacent grooves is the same as a distance between cell strings, that is, the adhesive film may be applicable to the cell strings with gaps.

A position of the groove 402 faces a position of the overlapped region, and a distance between adjacent grooves 402 matches the size of cells. The larger the size of the cells, the larger the distance between the adjacent grooves 402; the smaller the size of the cells, the smaller the distance between the adjacent grooves 402. In this embodiment, the adjacent grooves 402 are arranged with an equal distance. In other embodiments, distances between adjacent grooves may vary.

In this embodiment, in the direction parallel to the arrangement direction of the plurality of cells in one cell string, a cross section shape of the groove 402 is an arc. In other embodiments, in the direction parallel to the arrangement direction of the plurality of cells in one cell string, the cross section shape of the groove may be an inverted trapezoid, a square or an inverted triangle.

In this embodiment, in a direction parallel to the arrangement direction of the plurality of cells in one cell string, i.e., in a cross section direction perpendicular to the connecting line, a cross section width of the groove 402 is 5 mm to 20 mm, for example, 6 mm, 10 mm, 12 mm, 15 mm and 18 mm.

The adhesive film 401 may further include a plurality of protruding structures (not shown in the drawings) on a surface of the groove 402. A shape of the protruding structures may be triangular prisms or hemispheres. The protruding structures are advantageous for further buffering a pressure on the overlapped region in the laminating stage, and are advantageous for increasing a contact area between the adhesive film 401 and the cover plate, thereby strengthening sealing strength between the cover plate and the adhesive film 401.

The adhesive film 401 may further include a burring structure located on the first surface. A shape of the burring structure may be a triangular prism or a hemisphere. A size of the burring structure is smaller than a size of a protruding structure, which is advantageous not only for increasing friction between the cover plate and the adhesive film 401 during the overlapping stage, but also for relieving pressure on a non-overlapped region during lamination, thereby reducing the risk of cracking in the non-overlapped region.

In this embodiment, the peripheral region II of the adhesive film 401 is provided with the grooves 402, and a size and a number of the grooves 402 are related to a type of the cell string provided in the peripheral region II, the size of the cells and a size of the overlapped region. By adjusting the size and location of the grooves 402, the peripheral region II may accommodate both a cell string of a whole-piece type and a cell string of a half-piece type. In a production stage, the adhesive film 401 having the grooves 402 may be manufactured through a calender roll having a protruding structure.

During production of the photovoltaic module, the groove 402 corresponds to the overlapped region of the cell string. There is a gap between the adhesive film 401 and the cell string. During the laminating stage, the adhesive film 401 is melt under heat and fills the groove 402. In the laminating stage, the pressure on the region corresponding to the groove 402 of the adhesive film 401 is removed after passing the groove 402, thus the pressure on the overlapped region corresponding to the groove 402 is reduced, thereby greatly reducing the risk of cracking and fragmenting of the overlapped region. That is to say, in the laminating stage, the possibility that cracking or fragmenting of the overlapped region occurs in the peripheral region II is greatly reduced because the pressure on the overlapped region in the peripheral region II is small.

Therefore, using the adhesive film provided in this embodiment to produce photovoltaic modules is advantageous for improving yield of photovoltaic modules while improving module efficiency of the photovoltaic modules.

Figure 9:
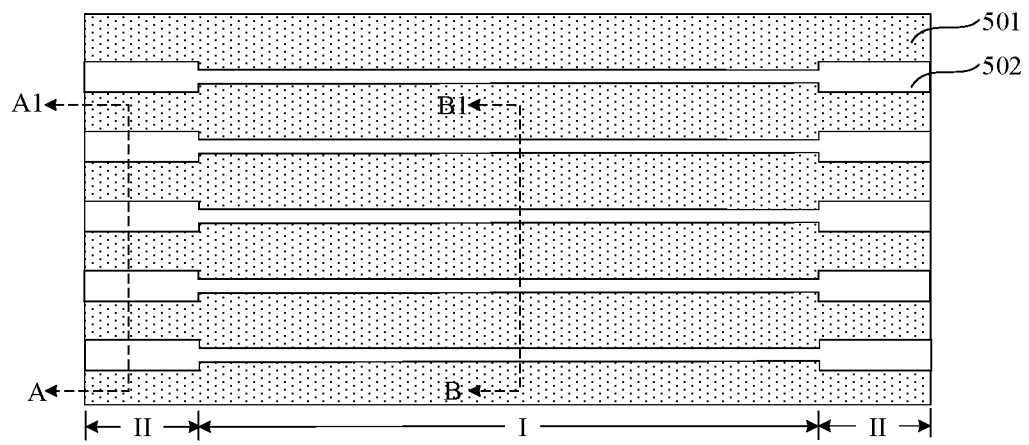
FIGS. 9 to 11 are schematic diagrams showing a structure of an adhesive film provided in a sixth embodiment of the present disclosure.
Figure 10:
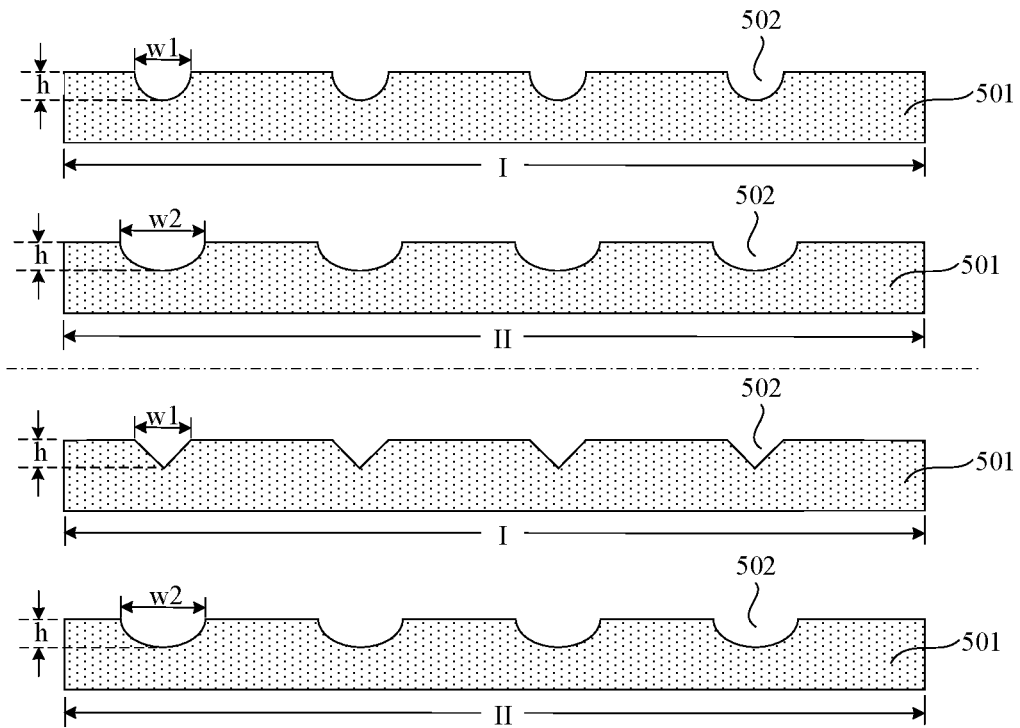
Figure 11:
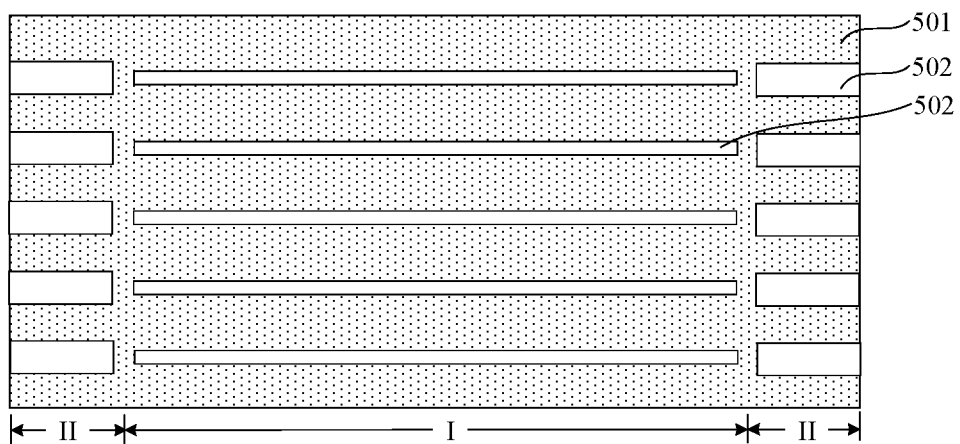

A sixth embodiment of the present disclosure further provides an adhesive film that is largely identical with the previous embodiment. Main differences include that the groove in the sixth embodiment is further located in the central region. The adhesive film provided in the sixth embodiment of the present disclosure is described in detail in the following with reference to the drawings. Contents identical with the previous embodiment may be seen in the above and is not repeated in the following. FIGS. 9 to 11 are schematic diagrams showing a structure of the adhesive film provided in the sixth embodiment of the present disclosure.

With reference to FIG. 9, in this embodiment, an adhesive film 501 is configured to form a photovoltaic module with a cell string that includes a plurality of cells. Adjacent cells of the cells share an overlapped region, the adhesive film 501 has a first surface (not shown) facing the cell string and a second surface (not shown) opposite to the first surface, and the first surface includes a central region I and a peripheral region II located at an outer side of the central region I. The adhesive film 501 includes at least one groove 502 extending from the first surface toward the second surface The at least one groove 502 is located in the central region I and the peripheral region II and a position of the groove 502 faces a position of at least one overlapped region. Herein, the groove 502 facing each overlapped region in the peripheral region II has a first capacity, the groove 502 facing each overlapped region located in the central region I has a second capacity, and the first capacity is larger than the second capacity.

In this embodiment, that the first surface is a rectangle is taken as an example, and the peripheral regions II are separately located at two opposite sides of the central region I. In other embodiments, a shape of the first surface may further be a square or a circle, and the peripheral region surrounds the central region. For a detailed description on the first surface, the central region and the peripheral region, detailed description in the previous embodiment may be referred to.

The adjacent cells have a connecting line in the overlapped region. The capacity refers to a capacity of the groove 502 within a length of the connecting line. The larger the capacity of the groove 502, the more adhesive film flowing into the groove 502 in a laminating stage, and the higher the groove 502's ability of removing pressure, and the more advantageous for reducing pressure on the overlapped region facing the groove 502. In other words, that the first capacity is larger than the second capacity practically is that: a cross section area of the groove 502 in the peripheral region II is larger than a cross section area of the groove 502 in the central region I in a direction parallel to an arrangement direction of the plurality of cells in one cell string, i.e., on a cross section perpendicular to the connecting line.

It is known from the above that in the laminating stage, the overlapped region in the peripheral region II is more prone to a risk of cracking than the overlapped region in the peripheral region I. In this embodiment, the grooves 502 are both located in the peripheral region II and the central region I, and the portion of groove 502 in the peripheral region II is more capable than the portion of groove 502 in the central region I in removing pressure. The portion of groove 502 in the peripheral region II can avoid cracking of the overlapped region in the central region I while avoiding cracking of the overlapped region in the peripheral region II, which is advantageous for further improving yield of photovoltaic modules by using the adhesive film 501.

In this embodiment, a depth h of the groove 502 in the peripheral region II is identical with a depth h of the groove 502 in the central region I.

The figures above the dotted lines in FIG. 10 are schematic diagrams showing a cross section structure along AA1 and BB1 in FIG. 9. As shown in FIG. 10, in one example, the adjacent cells have a connecting line in the overlapped region. In a cross section direction perpendicular to the connecting line, i.e., in a direction parallel to the arrangement direction of the plurality of cells in one cell string, a cross section shape of the groove 502 in the peripheral region II may be identical with a cross section shape of the groove 502 in the central region I. In the cross section direction (AA1) perpendicular to the connecting line, a cross section width of the groove 502 in the peripheral region II is larger than a cross section width of the groove 502 in the central region I.

The cross section width of the groove 502 in the central region I is a first width w1, the cross section width of the groove 502 in the peripheral region II is a second width w2, and a difference between the second width w2 and the first width w1 is larger than or equal to 2 mm and smaller than or equal to 5 mm, for example, w2−w1 is equal to 2.5 mm, 3 mm, 4.5 mm or 4 mm. In this way, a difference value between a width of the groove 502 in the peripheral region II and a width of the groove 502 in the central region I is medium, which enables a result of relieving pressure by the groove 502 in the peripheral region II to be better than a result of relieving pressure by the groove 502 in the central region I. Since w2−w1 is less than or equal to 5 mm, the difference value ensures that the error caused by the shrinkage of the adhesive film 501 is taken into account. Even if the adhesive film 501 shrinks, the width of the groove 502 in the peripheral area II is still larger than the width of the groove 502 in the central area I.

In the direction parallel to the arrangement direction of the plurality of cells in one cell string, the first width w1 is 3 mm to 15 mm, for example, 4 mm, 6 mm, 10 mm or 12 mm, and the second width w2 is 5 mm to 20 mm, for example, 6 mm, 10 mm, 15 mm or 18 mm.

The figures below the dotted lines in FIG. 10 are schematic diagrams showing another cross section structure along AA1 and BB1 in FIG. 9. As shown in FIG. 10, in another example, in a cross section direction perpendicular to the connecting line, i.e., in a direction parallel to the arrangement direction of the plurality of cells in one cell string, the cross section shape of the groove 502 in the peripheral region II may be different from the cross section shape of the groove 502 in the central region I, while a depth h of the groove 502 in the peripheral region II is identical with a depth h of the groove 502 in the central region I, and in the direction parallel to the arrangement direction of the plurality of cells in one cell string, the cross section width of the groove 502 in the peripheral region II may be larger than the cross section width of the groove 502 in the central region I. The cross section shape of the groove 502 in the central region I may be an inverted triangle, and the cross section shape of the groove 502 in the peripheral region II may be an arc.

In a direction parallel to an arrangement direction of a plurality of cells in one cell string, a cross section shape of a groove 502 in a peripheral region II may be different from a cross section shape of a groove 502 in a central region I. In this way, even if cross section depths and/or widths of the groove 502 in the central region and in the peripheral region are identical, it may be ensured that a cross section area of the groove 502 in the peripheral region II is larger than a cross section area of the groove 502 in the central region I in the direction parallel to the arrangement direction of the plurality of cells in one cell string by setting different shapes for the groove 502 in the central region I and in the peripheral region II.

However the shape, width or depth of the groove 502 in the peripheral region II and central region I is set, it meets what is required as long as the capacity of the groove 502 in the peripheral region II is larger than the capacity of the groove 502 in the central region I, or as long as the cross section area of the groove 502 in the peripheral region II is larger than the cross section area of the groove 502 in the central region I. For example, in the direction parallel to the arrangement direction of the plurality of cells in one cell string, the cross section width of the groove 502 in the peripheral region II is identical with the cross section width of the groove 502 in the central region I, and their depth are identical. In the direction parallel to the arrangement direction of the plurality of cells in one cell string, the cross section shape of the groove 502 in the peripheral region II is different from the cross section shape of the groove 502 in the central region I. Alternatively, in the direction parallel to the arrangement direction of the plurality of cells in one cell string, the cross section width of the groove 502 in the peripheral region II is larger than the cross section width of the groove 502 in the central region I, and the depth of the groove 502 in the peripheral region II is larger than the depth of the groove 502 in the central region I.

In one example, as shown in FIG. 9, one groove 502 crosses both the peripheral region II and the central region I. In another example, as shown in FIG. 11, the groove 502 in the peripheral region II is separated from the groove 502 in the central region I.

Besides, as shown in FIG. 9 or FIG. 11, in a direction of a long side of the first surface, one groove 502 in one peripheral region II may cross the peripheral region II. In other embodiments, in the direction along the long side of the first surface, one peripheral region II may further be provided with at least two mutually separated grooves, and the central region I is provided with a plurality of mutually separated grooves. In the direction along the long side of the first surface, a distance between adjacent grooves matches a distance between cell strings constituting the photovoltaic module.

In a production stage, the adhesive film 501 having the groove 502 may be manufactured through a calender roll having a periodically protruding structure.

In the adhesive film 501 provided in this embodiment, the groove 502 is located not only in the peripheral region II but also in the central region I, and the capacity of the groove 502 in the peripheral region II is larger than the capacity of the groove 502 in the central region I. In this way, not only a pressure on the overlapped region in the central region I and a pressure on the overlapped region in the peripheral region II can be reduced, but it may be ensured that the adhesive film 501 has a good encapsulation effect, thereby further improving yield of the photovoltaic modules and increasing the service life of the photovoltaic modules.

If a size of the groove in the central region is identical with that in the peripheral region, a total capacity of the groove in the adhesive film is large, which makes the volume of the adhesive film is too small when the film thickness is unchanged. When the adhesive film is used for encapsulation, poor encapsulation may occur, which affects the yield and service life of photovoltaic modules.

A seventh embodiment of the present disclosure further provides an adhesive film. The adhesive film provided in this embodiment is generally identical with that provided in the previous embodiment, and a difference lies in that the depth of the groove in the peripheral region II is larger than the depth of the groove in the central region I. The adhesive film provided in this embodiment is described in detail in the following with reference to the drawings. Contents identical with the previous embodiment may be seen in the above and is not repeated in the following.

Figure 12:
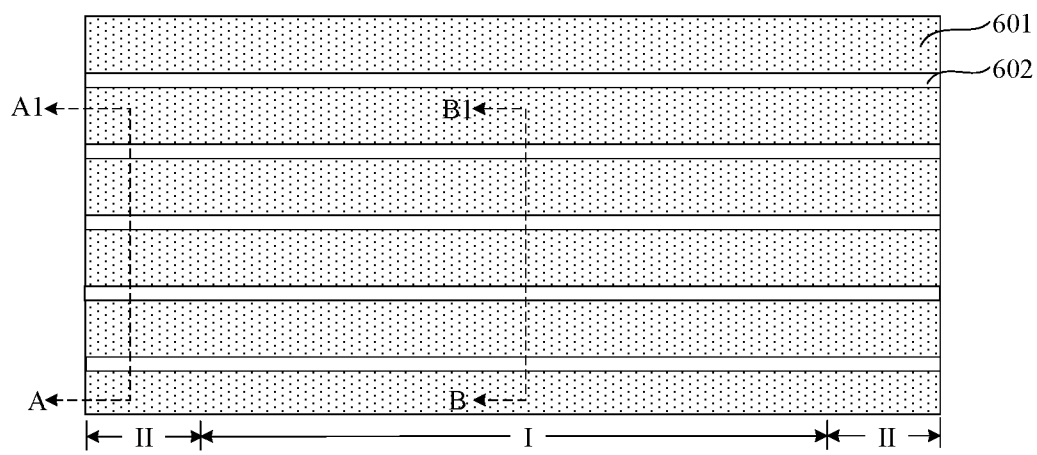
FIGS. 12 to 13 are schematic diagrams showing a structure of an adhesive film provided in a seventh embodiment of the present disclosure.
Figure 13:
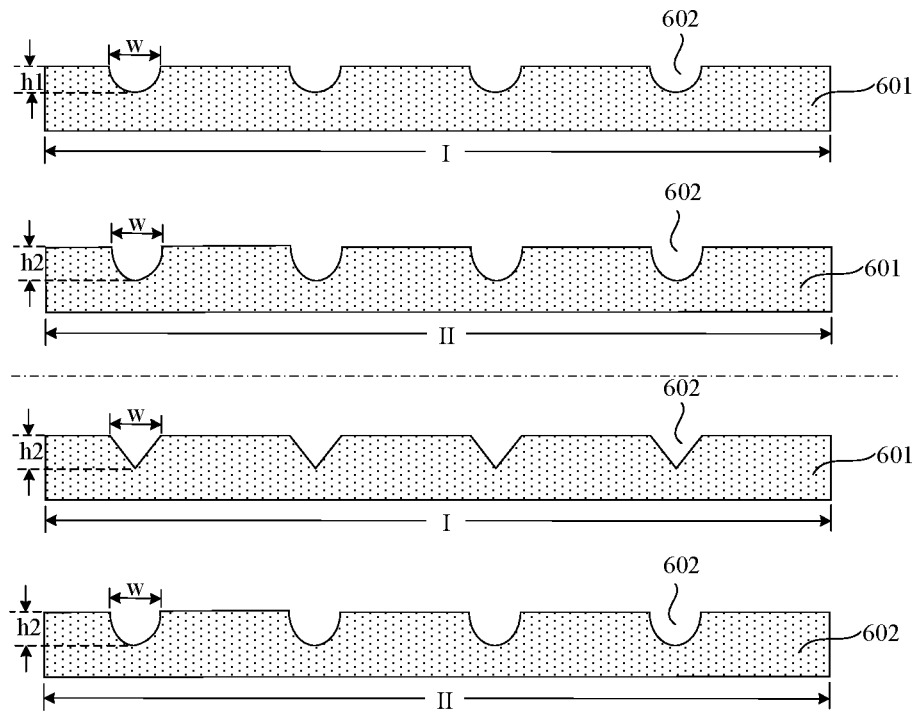

FIGS. 12 to 13 are schematic diagrams showing a structure of the adhesive film provided in the seventh embodiment of the present disclosure.

Referring to FIG. 12, FIG. 12 is a schematic top-view structure of the adhesive film. An adhesive film 601 includes a first surface and a second surface and includes a central region I and peripheral regions II, a groove 602 extending from the first surface toward the second surface. Each groove 602 is located in the central region I and the peripheral region II, and a position of the groove 602 faces a position of at least one overlapped region. Herein, the groove 602 facing each overlapped region located in the peripheral region II has a first capacity, the groove 602 facing each overlapped region located in the central region I has a second capacity, and the first capacity is larger than the second capacity.

The adhesive film is used to form a photovoltaic module with the cell string, the adjacent cells in the cell string have a connecting line in the overlapped region, and an extending direction of the connecting line is perpendicular to a direction of AA1. In a direction perpendicular to the connecting line, that is, in a direction parallel to the arrangement direction of the multiple cells in one cell string, a cross section area of the groove 602 in the peripheral region II is larger than the cross section area of the groove 602 in the central region I.

In this embodiment, in the direction parallel to the arrangement direction of the plurality of cells in one cell string, a cross section width w of the groove 602 in the peripheral region II is identical with a cross section width w of the groove 602 in the central region I.

In one example, as shown in FIG. 13, the figures above the dotted lines in FIG. 13 are schematic diagrams showing a cross section structure along AA1 and BB1 in FIG. 12, a depth of the groove 602 in the peripheral region II is larger than a depth of the groove 602 in the central region I. The depth of the groove 602 in the central region I is a first depth h1, the depth of the groove 602 in the peripheral region II is a second depth h2, and the second depth h2 is larger than the first depth h1. Herein, in the direction parallel to the arrangement direction of the plurality of cells in one cell string, a cross section shape of the groove 602 in the central region I is identical with a cross section shape of the groove 602 in the peripheral region II. In other embodiments, in a direction parallel to an arrangement direction of a plurality of cells in one cell string, a cross section shape of a groove in a central region may further be different from a cross section shape of a groove in a peripheral region.

The figures below the dotted lines in FIG. 13 are schematic diagrams showing another cross section structure along AA1 and BB1 in FIG. 12. As shown in FIG. 13, in another example, a depth h of the groove 602 in the peripheral region II is identical with a depth h of the groove 602 in the central region I, and in the direction parallel to the arrangement direction of the plurality of cells in one cell string, the cross section width w of the groove 602 in the peripheral region II may further be identical with the cross section width w of the groove 602 in the central region I. Herein, in the direction parallel to the arrangement direction of the plurality of cells in one cell string, the cross section shape of the groove 602 in the peripheral region II may be different from the cross section shape of the groove 602 in the central region I. The cross section shape of the groove 602 in the central region I may be an inverted triangle, and the cross section shape of the groove 602 in the peripheral region II may be an arc.

Figure 14:
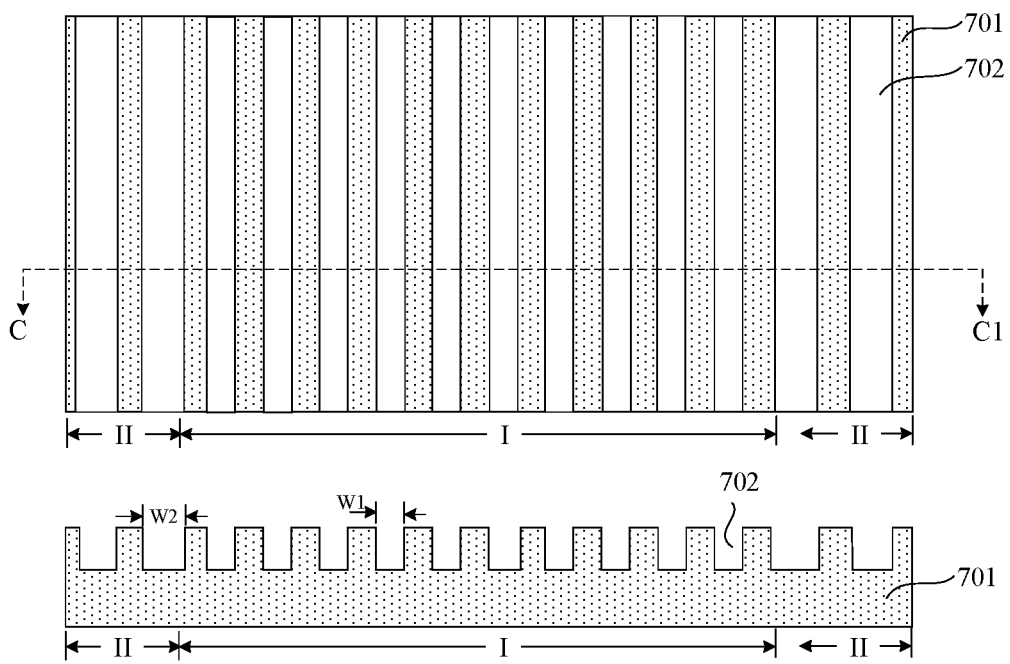
FIG. 14 is a schematic diagram showing a structure of an adhesive film provided in a eighth embodiment of the present disclosure.

An eighth embodiment of the present disclosure further provides an adhesive film which is generally identical with the adhesive film in the previous embodiment. The adhesive film is mainly different in that the extending direction of the groove is the extending direction of a short side of the first surface. The adhesive film provided in the eighth embodiment is described in detail in the following with reference to the drawings. Contents identical with the previous embodiment may be seen in the above and is not repeated in the following. FIG. 14 is a schematic diagram showing a structure of the adhesive film provided in the eighth embodiment, including a schematic top-view structure and a schematic cross-sectional-view structure along CC1.

With reference to FIG. 14, in this embodiment, an adhesive film 701 includes a groove 702 that extends from a first surface to a second surface, the first surface includes a central region I and a peripheral region II, and each groove 702 is located in the central region I and the peripheral region II. The groove facing each overlapped region located in the peripheral region has a first capacity, the groove facing each overlapped region located in the central region has a second capacity, and the first capacity is larger than the second capacity.

In this embodiment, the first surface is a rectangle, and the extending direction of the same groove 702 is identical with an extending direction of the extending direction of the short side of the first surface.

An overlapped region of adjacent cells in one cell string has a connecting line, and an extending direction of the connecting line is perpendicular to a direction of CC1, that is, the extending direction of the connecting line is identical with the extending direction of the short side of the first surface, and the adjacent cells are arranged along a long side of the first surface. The extending direction of the connecting line is parallel to an arrangement direction of a plurality of cells in one cell string.

In this embodiment, in a direction parallel to an arrangement direction of the plurality of cells in one cell string, a cross section area of the groove 702 in the peripheral region II is larger than a cross section area of the groove 702 in the central region I.

In one example, a depth of the groove 702 in the central region I is identical with a depth of the groove 702 in the peripheral region II, and in the direction parallel to the arrangement direction of the plurality of cells in one cell string, a cross section width of the groove 702 in the peripheral region II is larger than a cross section width of the groove 702 in the central region I. The groove 702 in the central region I has a first width W1, the groove 702 in the peripheral region II has a second width W2, and the second width W2 is larger than the first width W1. Herein, a cross section shape of the groove 702 in the central region I may be identical with the cross section of the groove 702 in the peripheral region II, for example, both are rectangles; the cross section shape of the groove 702 in the central region I may also be different from the cross section of the groove 702 in the peripheral region II.

In another example, a depth of the groove 702 in the central region I is smaller than a depth of the groove 702 in the peripheral region II, and in the direction parallel to the arrangement direction of the plurality of cells in one cell string, a cross section width of the groove 702 in the peripheral region II is equal to a cross section width of the groove 702 in the central region I. Alternatively, the depth of the groove 702 in the central region I is smaller than the depth of the groove 702 in the peripheral region II, and in the direction parallel to the arrangement direction of the plurality of cells in one cell string, a cross section width of the groove 702 in the peripheral region II is smaller than a cross section width of the groove 702 in the central region I.

As shown FIG. 14, one groove 702 in the peripheral region II crosses the short side of the first surface, and one groove 702 in the central region I crosses the short side of the first surface. In other embodiments, a plurality of separate grooves 702 is provided in an extending direction of the short side of the first surface. The number of grooves extending in the direction of short side of the first surface may be reasonably set in accordance with a type of the cell string of the photovoltaic module.

Figure 15:
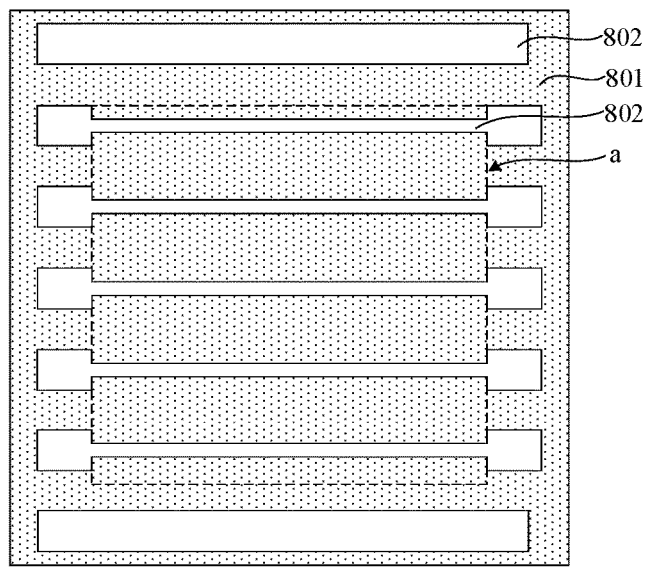
FIG. 15 is a schematic diagram showing a top-view structure of an adhesive film provided in a ninth embodiment of the present disclosure.

A ninth embodiment of the present disclosure further provides an adhesive film which is generally identical with that in the previous embodiment, and a main difference lies in that the peripheral region are located at two opposite sides of the central region in the previous embodiment while the peripheral region surrounds the central region in the ninth embodiment. FIG. 15 is a schematic top-view structure of the cover plate provided in the ninth embodiment.

With reference to FIG. 15, an adhesive film 801 has a first surface and a second surface, and the first surface has a central region and a peripheral region that surrounds the central region. Herein, a region within dotted lines a is the central region, and a region outside dotted lines a is the peripheral region. The adhesive film 801 further includes a groove 802 extending from the first surface toward the second surface, and the groove 802 is located in the central region and the peripheral region. Herein, the groove facing each overlapped region in the peripheral region has a first capacity, the groove facing each overlapped region located in the central region has a second capacity, and the first capacity is larger than the second capacity.

Detailed description on the first capacity and second capacity may be seen in the previous embodiments and is not repeated herein.

In this embodiment, there is a connecting line in an overlapped region of the cell string, and in a cross-section direction perpendicular to the connecting line, i.e., in a direction parallel to an arrangement direction of a plurality of cells in one cell string, a cross section width of the groove 802 in the peripheral region is larger than a cross section width of the groove 802 in the central region. In other embodiments, a cross section width of the groove in the peripheral region may also be equal to a cross section width of the groove in the central region.

For a size relationship between the groove in the peripheral region and in the central region, the description in the previous embodiments may be referred to. It meets what is required as long as a cross section area of the groove in the peripheral region is larger than a cross section area of the groove in the central region in a cross section direction perpendicular to the connecting line.

In other embodiments, the adhesive film has grooves extending from a first surface to a second surface. The grooves include a plurality of grooves extending along a long side of the first surface and a plurality of grooves extending along a short side of the first surface. For the plurality of grooves extending in one extending direction, the groove facing each overlapped region located in the peripheral region II has a first capacity, the groove facing each overlapped region located in the central region I has a second capacity, and the first capacity is larger than the second capacity. For the plurality of grooves extending in one direction, there is a connecting line in an overlapped region of a cell string. In a cross section direction perpendicular to the connecting line, a cross section area of the groove in the peripheral region II is larger than a cross section area of the groove in the central region.

Embodiments of the present disclosure further provide a photovoltaic module, including the functional part mentioned in any of the above embodiments, where the functional part is an adhesive film.

Figure 16:
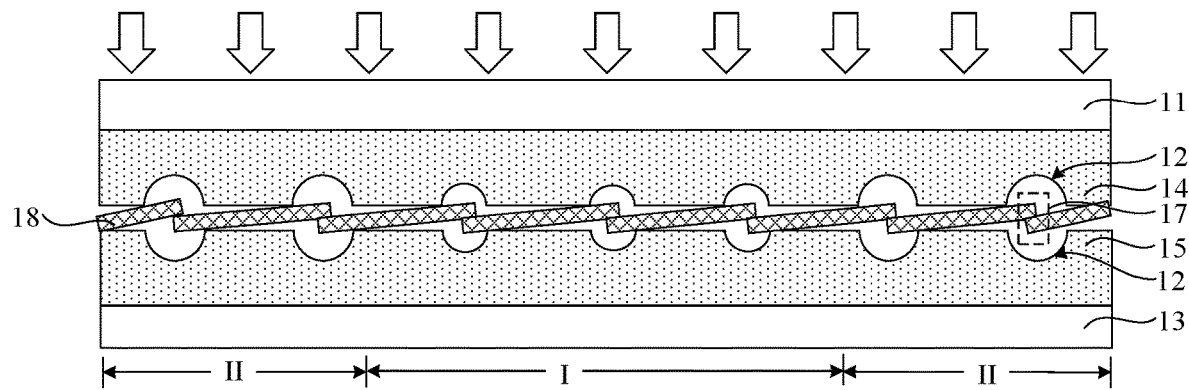
FIG. 16 is a schematic diagram showing a cross-sectional-view structure of a photovoltaic module provided in a tenth embodiment of the present disclosure.

FIG. 16 is a schematic diagram showing a cross-sectional-view structure of a photovoltaic module in a tenth embodiment.

Referring to FIG. 16, the photovoltaic module includes: a first cover plate 13, a first adhesive film 15, a cell string, a second adhesive film 14 and a second cover plate 11, all of which are stacked in sequence, and either or both of the first adhesive film 15 and the second adhesive film 14 is the functional part mentioned in any of the above embodiments and the functional part is an adhesive film. The cell string includes a plurality of cells 18, adjacent cells 18 share an overlapped region 17, and each groove 12 faces at least one overlapped region 17.

The photovoltaic module may be a single-glass photovoltaic module or a double-glass photovoltaic module. The cell string further includes a welding ribbon located in the overlapped region 17 and the adjacent cells 18 are connected through the welding ribbon.

One of the first cover plate 13 and the second cover plate 11 is a front plate and the other is a back plate. In this embodiment, the second cover plate 11 is a back plate and the first cover plate 13 is a front plate. The first cover plate 13 is a glass cover plate and the second cover plate 11 is a glass cover plate, a polymer cover plate or a stainless-steel cover plate.

In this embodiment, the first adhesive film 15 is the adhesive film mentioned in the above embodiments, that is, the first adhesive film 15 has a groove 12. The second adhesive film 14 is the adhesive film mentioned in the above embodiments, the second adhesive film 14 has a groove 12, and the groove 12 arranged in the first adhesive film 14 faces the groove 12 arranged in the second adhesive film 15. That is, the same overlapped region 17 faces two grooves 12 respectively arranged in the first adhesive film 15 and the second adhesive film 14.

The big arrows in FIG. 16 show a laminating pressure on the photovoltaic module in the laminating stage. In the laminating stage, the groove 12 may buffer the pressure on the overlapped region 17, reduce the pressure on the overlapped region 17, so as to prevent a risk of cracking and fragmenting of the overlapped region.

In addition, in this embodiment, both the first adhesive film 15 and the second adhesive film 14 include a central region I and peripheral regions II, and the grooves 12 are located both in the central region I and peripheral regions II. The details about the central region I and the peripheral regions II may refer to the above embodiments and are not repeated here.

In other embodiments, the groove may only be located in the peripheral regions and the central region is not arranged with the grooves.

Figure 18:
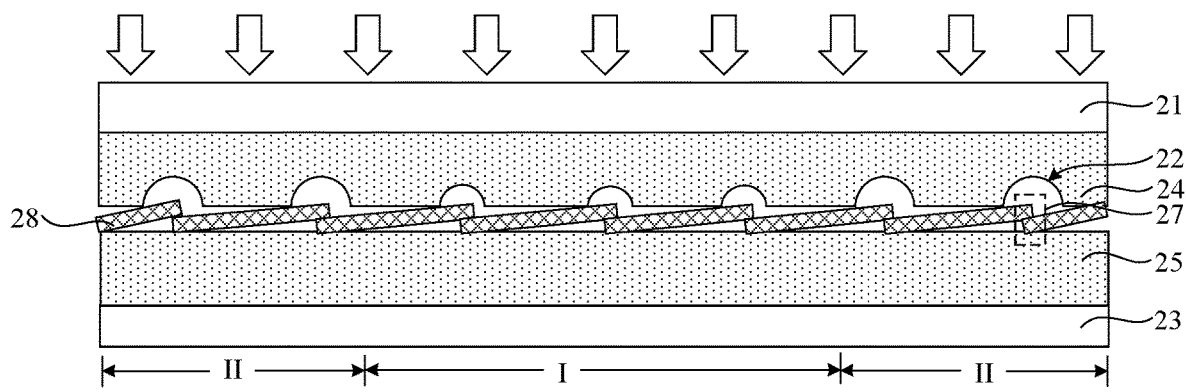
FIG. 18 is a schematic diagram showing a cross-sectional-view structure of a photovoltaic module provided in an eleventh embodiment of the present disclosure.

An eleventh embodiment of the present disclosure further provides a photovoltaic module, and compared with the tenth embodiment, the second adhesive film is the above functional part and the second adhesive film has a groove in this embodiment. FIG. 18 a schematic diagram showing a cross-sectional-view structure of a photovoltaic module in the eleventh embodiment.

Referring to FIG. 18, the photovoltaic module includes a first cover plate 23, a first adhesive film 25, a cell string, a second adhesive film 24 and a second cover plate 21. At least one of the first adhesive film 25 and the second adhesive film 24 is the functional part mentioned in any of the above embodiments and the functional part is an adhesive film. The cell string includes a plurality of cells 28, adjacent cells 28 share an overlapped region 27, and each groove 22 faces at least one overlapped region 27.

The second adhesive film 24 is the above adhesive film and the second adhesive film 24 has a groove 22. In the process of laminating the photovoltaic module, the pressure is applied to a surface of the second cover plate 21 where the surface of the second cover plate 21 is away from the second adhesive film 24. The groove 22 may buffer the pressure applied to the overlapped region 27, thereby improving the yield of the photovoltaic module.

The big arrows in FIG. 18 show a laminating pressure on the photovoltaic module in the laminating stage. In this embodiment, the second adhesive film 24 includes a central region I and peripheral regions II, and the grooves 22 are located both in the central region I and peripheral regions II.

In other embodiments, the first adhesive film has grooves and the second adhesive film isn't arranged with grooves. In the laminating stage, the grooves located below the overlapped regions provide space to release the pressure and buffer the pressure on the overlapped regions 27 to some extent, so as to improve the yield of the photovoltaic module.

Figure 19:
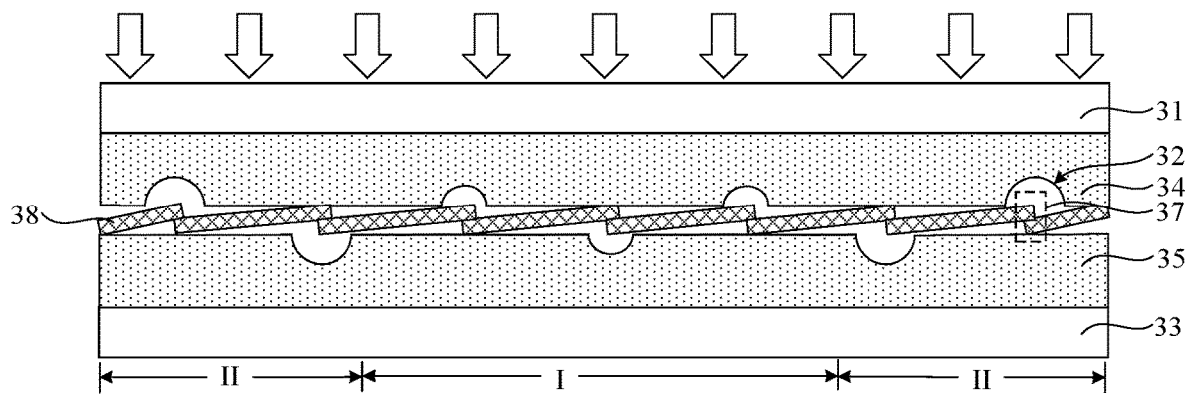
FIG. 19 is a schematic diagram showing a cross-sectional-view structure of a photovoltaic module provided in a twelfth embodiment of the present disclosure.

A twelfth embodiment of the present disclosure further provides a photovoltaic module, and compared with the above embodiments, both the first adhesive film and the second adhesive film is the adhesive film mentioned in the above embodiments, and the grooves arranged in the second adhesive film and the grooves arranged in the first adhesive film are staggered. FIG. 19 is a schematic diagram showing a cross-sectional-view structure of a photovoltaic module in the twelfth embodiment.

Referring to FIG. 19, the photovoltaic module includes a first cover plate 33, a first adhesive film 35, a cell string, a second adhesive film 34 and a second cover plate 31. Both the first adhesive film 35 and the second adhesive film 34 is the adhesive film mentioned in any of the above embodiments, and the first adhesive film 35 and the second adhesive film 34 has grooves 32. The cell string includes a plurality of cells 38, adjacent cells 38 share an overlapped region 37, and each groove 32 faces at least one overlapped region 27.

In this embodiment, the grooves 32 arranged in the second adhesive film 34 and the grooves 32 arranged in the first adhesive film 35 are staggered. In addition, the first adhesive film 35 and the second adhesive film 34 include a central region I and peripheral regions II, and the grooves 32 are located both in the central region I and peripheral regions II. The same peripheral region II may be arranged with one groove or more than one groove, for example, only the peripheral region II of the first adhesive film 35 is arranged with one groove, or, only the peripheral region II of the second adhesive film 35 is arranged with one groove.

Compared with the previous embodiment, the quantity of materials in the first adhesive film and the second adhesive film in this embodiment is larger than that in the eleventh embodiment when the thickness of the first adhesive film and the second adhesive film in this embodiment is the same with that in the eleventh embodiment. Therefore, in this embodiment, the encapsulating effect of the first adhesive film and the second adhesive film can be improved while reducing the risk of the cracking of the overlapped regions in the central region I and peripheral regions II.

Embodiments of the present disclosure further provide a method for manufacturing a photovoltaic module. The method includes the following steps.

Referring to FIG. 16, a first cover plate 13, a first adhesive film 15, a cell string, a second adhesive film 14 and a second cover plate 11 are stacked in sequence to form a stacked structure, and at least one of the first adhesive film 15 and the second adhesive film 14 is the adhesive film mentioned in any of the above embodiments. The cell string includes a plurality of cells 18, adjacent cells 18 share an overlapped region 17, and each groove 12 faces at least one overlapped region 17.

In this embodiment, the first adhesive film 15 and the second adhesive film 14 is the adhesive film mentioned in the above embodiments, and the groove 12 arranged in the first adhesive film 15 faces the groove 12 arranged in the second adhesive film 14. Both the first adhesive film 15 and the second adhesive film 14 include a central region I and peripheral regions II, and the grooves 12 are located both in the central region I and peripheral regions II.

In the stacking-up stage, the position of the groove 12 corresponds to the overlapped region 17 of the cell 18, so as to position the cell string.

In other embodiments, as shown in FIG. 18, either one of the first adhesive film and the second adhesive film is the adhesive film mentioned in the above embodiments. Or, as shown in FIG. 19, both the first adhesive film and the second adhesive film are the adhesive film, and the grooves arranged in the first adhesive film and the grooves arranged in the second adhesive film are staggered.

In other embodiments, the overlapped region shared by adjacent cells 28 includes connecting lines, and in the direction perpendicular to the connecting lines, the shape and size of the groove in the central region may be the same with that in the peripheral regions.

Figure 17:
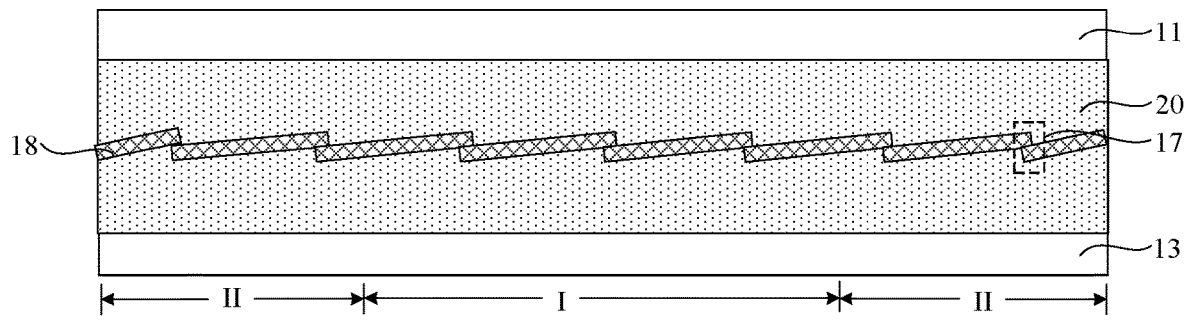
FIG. 17 is a schematic diagram showing a cross-sectional-view structure of a photovoltaic module after a laminating process.

Referring to FIG. 16 to FIG. 17, FIG. 17 is a schematic diagram showing a cross-sectional-view structure of a photovoltaic module which has been laminated. The photovoltaic module is laminated to form the laminated photovoltaic module.

An air extraction process is performed to remove air in the overlapped structure. Before a laminating stage, the overlapped structure in the peripheral region II warps upwards relative to the central region I, and in the laminating stage, a pressure is applied to the second cover plate 11 and the stacked structure is heated to melt and mix the first adhesive film 15 and the second adhesive film 14 to fill the grooves 12 to form the adhesive film layer 10. The grooves 12 in the peripheral region II may buffer a pressure on the overlapped region by the second cover plate 11 to reduce a pressure on the overlapped region, thereby reducing a risk of cracking of the overlapped region 17. Similarly, a pressure on the overlapped region in the central region I is also reduced.

The method for manufacturing a photovoltaic module can improve the yield of the photovoltaic module and the reliability of the photovoltaic module.

Inventors of the present disclosure found that a photovoltaic module includes a central region and a peripheral region located at an outer side of the central region, and the risk of cracking and fragmenting in the overlapped region of the peripheral region is higher than that in the central region. A further analysis shows that reasons for this problem include: the method for manufacturing a photovoltaic module includes a stacking-up stage and a laminating stage. In the stacking-up stage, a back plate, a lower adhesive film, a cell string, an upper adhesive film and a front plate are stacked in sequence to form a stacked structure, and in the stacking-up process, an air extraction process is performed first to remove air between layers of the overlapped structure, and a pressure treatment is performed after the air extraction process. During or after the air extraction process, the peripheral region warps upwards, and the warping of the peripheral region is increased by a heating process to some extent when the heating process is performed during or after the air extraction process. In order to remove upward warping of the peripheral region, during the laminating stage, a pressure applied to the peripheral region may be higher than a pressure applied to the central region, which, however, may cause a higher risk of cracking and fragmenting to the overlapped region in the peripheral region. Alternatively, in order to remove the upward warping of the peripheral region, even if the pressure applied to the peripheral region during the laminating stage is the same with the pressure applied to the central region, there is a higher risk of cracking or fragmenting of the overlapped region in the peripheral region than in the central region, due to a deformation of the front plate and back plate in the peripheral region being greater than a deformation of the front plate and back plate in the central region in the laminating stage.

In order to address the above issue, some embodiments of the present disclosure further provide a functional part, where the functional part is a cover plate, which is used to form a photovoltaic module together with a cell string. A peripheral region of the cover plate is arranged with a groove to buffer a pressure on the overlapped region in the peripheral region, so as to prevent the risk of cracking and fragmenting of the overlapped region during manufacturing of the photovoltaic module, thereby improving yield of photovoltaic modules made by using the cover plate.

Figure 20:
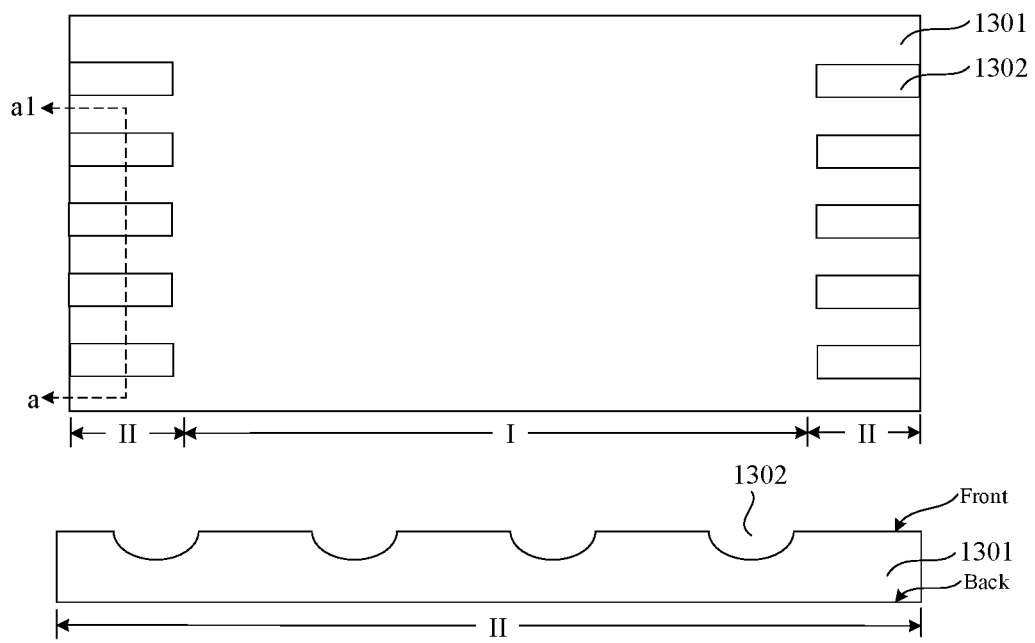
FIG. 20 is a schematic diagram showing a structure of a cover plate provided in a thirteenth embodiment of the present disclosure.

FIG. 20 is a schematic diagram showing a structure of the cover plate in a thirteenth embodiment of the present disclosure, including a top-view structure diagram and a cross-sectional-view structure diagram along an aa1 cutting line.

Referring to FIG. 20, in this embodiment, the cover plate is used to form a photovoltaic module together with a cell string. The cell string cell includes a plurality of cells, and adjacent cells share an overlapped region. The cover plate has a first surface Front which faces the cell string and a second surface Back which is opposite to the front surface. The first surface includes a central region I and a peripheral region II located at an outer side of the central region. The cover plate includes at least one groove 1302 which extends from the Front to the Back, the grooves 1302 are located in the peripheral region II, and each groove faces at least one overlapped region.

The cover plate in this embodiment is described in detail in the following with reference to the drawings.

In one example, the cover plate 1301 is configured as a front plate of the photovoltaic module, and the cover plate 1301 may be a glass cover plate. In another example, the cover plate 1301 is configured as a back plate of the photovoltaic module, and the cover plate 1301 may be a glass cover plate, a polymer cover plate or a stainless-steel cover plate. In further another example, the cover plate 1301 may be configured as both a front plate and a back plate of the photovoltaic module.

The peripheral regions II may be located at two opposite sides of the central region I. Alternatively, the peripheral region II may surround the central region I.

A width of the peripheral region II may be a width across at least one cell string. In this way, when the photovoltaic module is formed, the peripheral region II faces at least one cell string. Alternatively, the width of the peripheral region II may be 1/N a width of a single cell string, N being larger than 1. In this way, when the photovoltaic module is formed, the peripheral region II faces 1/N the cell string. Alternatively, the width of the peripheral region II may be a sum of a width of n cell strings and 1/N the width of the single cell string, n being a natural number larger than or equal to 1. In this way, when the photovoltaic module is formed, the peripheral region II faces (n+1/N) the cell string. Herein, the width described above refers to a width in a direction perpendicular to an arrangement direction of a plurality of cells in one cell string.

The width of the peripheral region II is related to a size of the Front, and the width of the peripheral region II may be reasonably set in accordance with the size of the Front. Specifically, the larger the size of the Front, the larger area of the peripheral region II having the problem of upward warping, and correspondingly, the larger width the peripheral region II. The smaller the size of the Front, the smaller area having the problem of upward warping, and correspondingly, the smaller width the peripheral region II.

It shall be noted that a location relationship between the peripheral region II and the central region I is related to a shape of the first surface Front. For example, in this embodiment, the shape of the Front is a rectangle, both the central region I and the peripheral regions II are arranged across a short side of the Front and along a long side of the Front, and the peripheral regions II is separately located at the two opposite sides of the central region I. In other embodiments, the shape of the first surface is a rectangle or a circle, and the peripheral region surrounds the central region.

In this embodiment, in the direction of the long side of the first surface Front, the width of the peripheral region II is 10 mm to 20 mm, for example, 12 mm, 15 mm or 17 mm.

It may be appreciated that in other embodiments, the shape of the first surface may further be a triangle, a trapezoid, a regular polygon or an irregular shape. A region where upward warping easily occurs may be reasonably predicted in accordance with the shape of the first surface, and correspondingly, the region where upward warping easily occurs is the peripheral region. For example, if the shape of the first surface is a triangle, the peripheral region is located in a region where three angles of the first surface are located, and the first surface has one central region and three peripheral regions.

Since the peripheral region II has at least one groove 1302, during a laminating process of using the cover plate 1301 to produce the photovoltaic module, a laminating pressure on a region of the cover plate 1301 corresponding to the groove 1302 is transmitted to the overlapped region after passing through the groove 1302, so that a pressure on the overlapped region facing the groove 1302 is reduced or removed, thereby greatly reducing a risk of cracking or fragmenting of the overlapped region in the peripheral region II, and improving yield of the photovoltaic module. In addition, in the laminating stage, an adhesive film at the groove 1302 is melt under heat and fills the groove 1302, so a flow region of the adhesive film is increased, thereby reducing pressure applied to the overlapped region by the adhesive film, which may further promote yield of the photovoltaic module to some extent.

An extending direction of one groove 1302 is the same as an extending direction of a connecting line of the adjacent cells in one cell string in the overlapped region. In other words, the extending direction of one groove 1302 is perpendicular to the arrangement direction of the plurality of cells in one cell string. That is to say, an arrangement direction of the grooves is related to an arrangement location of the cell string. In this embodiment, one groove 1302 extends in a horizontal direction, different grooves 1302 are arranged separately in a vertical direction. "The horizontal direction" refers to a direction of the long side of the first surface, while "the vertical direction" refers to a direction of the short side of the first surface. Correspondingly, when the photovoltaic module is formed, the arrangement of cells in the peripheral region II are as follows: cells in one cell string are arranged in the vertical direction, and the connecting line of overlapped regions in one cell string extends in a horizontal direction. In other embodiments, one groove may further extend in the vertical direction, and different grooves are separately arranged in a horizontal direction. Correspondingly, when the photovoltaic module is formed, an arrangement of cells in the peripheral region is: cells in one cell string are arranged in the horizontal direction and the connecting line of the overlapped region in one cell string extends in the vertical direction. In yet another example, the grooves includes a first groove extending in the horizontal direction and a second groove extending in the vertical direction, and a cell string includes a first cell string where cells are arranged in the vertical direction and a second cell string where cells are arranged in the horizontal direction.

Further, in this embodiment, in the extending direction of the connecting line which is of the adjacent cells in one cell string and which is in the overlapped region, i.e., in a direction perpendicular to the arrangement direction of the plurality of cells in one cell string, one peripheral region II has one groove 1302, and the groove 1302 may either face one overlapped region of one cell string or face an overlapped region of at least two cell strings. That is, the cover plate 1301 may be applicable to cell strings without gaps or cell strings with gaps. In other embodiments, in the extending direction of the connecting line, which is in the overlapped region of the adjacent cells in one cell string, one peripheral region may alternatively have at least two grooves, and a distance between adjacent grooves is the same as a distance between cell strings, that is, the cover plate may be applicable to the cell strings with gaps.

The groove 1302 faces the overlapped region, and a distance between adjacent grooves 1302 matches the size of cells. Specifically, the larger the size of the cells, the larger the distance between the adjacent grooves 1302, and the smaller the size of the cells, the smaller the distance between the adjacent grooves 1302. In this embodiment, the adjacent grooves 1302 are arranged with an equal distance. In other embodiments, distances between adjacent grooves may vary. Herein, the size of the cells may be 150 mm to 250 mm.

In this embodiment, in a direction parallel to the arrangement direction of the plurality of cells in one cell string, i.e., in a cross section direction perpendicular to the connecting line, a cross section width of the groove 1302 is 5 mm to 20 mm, for example, 6 mm, 10 mm, 12 mm, 15 mm and 18 mm.

In this embodiment, in the direction parallel to the arrangement direction of the plurality of cells in one cell string, i.e., in the cross section direction perpendicular to the connecting line, a cross section shape of the groove 1302 is an arc. In other embodiments, in the direction parallel to the arrangement direction of the plurality of cells in one cell string, the cross section shape of the groove may be an inverted trapezoid, a square or an inverted triangle.

In the direction parallel to the arrangement direction of the adjacent cells in one cell string, a width of the groove 1302 is larger than or equal to a width of the overlapped region, which is advantageous for ensuring that pressures on regions of the overlapped region are comparatively small, thereby further reducing the risk of cracking and fragmenting of the overlapped region. Specifically, an orthographic projection of the overlapped region on the first surface is a first projection, an orthographic projection of the groove 1302 on the first surface is a second projection, and in the direction parallel to the arrangement direction of the plurality of cells in one cell string, a boundary of the first projection and a boundary of the second projection are overlapped, or the boundary of the first projection is located within the boundary of the second projection.

A depth of the groove 1302 is smaller than or equal to half a thickness of the cover plate 1301. In this way, the depth of the groove 1302 takes an appropriate rate of a thickness of the cover plate 01, so that the cover plate 1301 of the region where the groove 1302 is located still has good strength, thereby preventing the cover plate 01 from cracking. The depth of the groove 1302 may further be larger than ⅙ the thickness of the cover plate 1301. For example, the depth of the groove 1302 is ⅓, ¼ or ⅕ the thickness of the cover plate 1301. In this way, the groove 1302 has sufficient capacity while ensuring strength of the cover plate 1301, which is advantageous for improving an ability of the groove 1302 to buffer or remove pressure.

In this embodiment, the cover plate 1301 may further include a plurality of protruding structures (not shown in the drawings) on a surface of the groove 1302. A shape of the protruding structures may be triangular prisms or hemispheres. The protruding structures is advantageous for further buffering a pressure on the overlapped region in the laminating stage, and is advantageous for increasing a contact area between the cover plate 1301 and the adhesive film, thereby strengthening sealing strength between the cover plate 1301 and the adhesive film.

In addition, the cover plate 1301 may further include: a burring structure located on the first surface. A shape of the burring structure may be a triangular prism or a hemisphere. A size of the burring structure is smaller than a size of a protruding structure, which is advantageous not only for increasing friction between the cover plate 1301 and the adhesive film during the overlapping stage, but also for buffering pressure on a non-overlapped region during lamination, thereby reducing the risk of cracking in the non-overlapped region.

In this embodiment, the peripheral region II of the cover plate 1301 is arranged with the grooves 1302, and a size and a number of the grooves 1302 are related to a type of the cell string arranged in the peripheral region II, the size of the cells and a size of the overlapped region. By adjusting the size and the location of the grooves 1302, the peripheral region II may accommodate a cell string of a whole-piece type or a cell string of a half-piece type.

In a producing stage, the cover plate 1301 having the grooves 1302 may be manufactured through a calender roll having a protruding structure.

During production of the photovoltaic module, the groove 1302 corresponds to the overlapped region of the cell string, and there is the adhesive film between the cover plate 1301 and the cell string. During the laminating stage, the adhesive film corresponding to the groove 1302 is melt under heat and fills the groove 1302. In the laminating stage, the pressure on the region corresponding to the groove 1302 of the cover plate 1301 is removed after passing the groove 1302, thus the pressure on the overlapped region corresponding to the groove 1302 is reduced, thereby greatly reducing the risk of cracking and fragmenting of the overlapped region. That is to say, in the laminating stage, even if the peripheral region II of the cover plate 1301 has a larger pressure compared with the central region I of the cover plate 1301, or a deformation of the peripheral region II of the cover plate 1301 is greater as compared with that of the central region of the cover plate 1301, the possibility that cracking or fragmenting of the overlapped region occurs in the peripheral region II is greatly reduced due to the pressure on the overlapped region in the peripheral region II being small.

Therefore, using the cover plate in this embodiment to produce the photovoltaic module is advantageous for improving yield of the photovoltaic module while improving module efficiency of the photovoltaic module.

A fourteen embodiment of the present disclosure further provides a cover plate that is largely identical with the first embodiment. Main differences includes that the groove in the fourteen embodiment is further located in the central region. The cover plate in the fourteen embodiment of the present disclosure is described in detail in the following with reference to the drawings. Contents identical with the first embodiment may be seen in the above and is not repeated in the following. FIGS. 21 to 27 are schematic diagrams showing a structure of the cover plate in the fourteen embodiment of the present disclosure.

Figure 21:
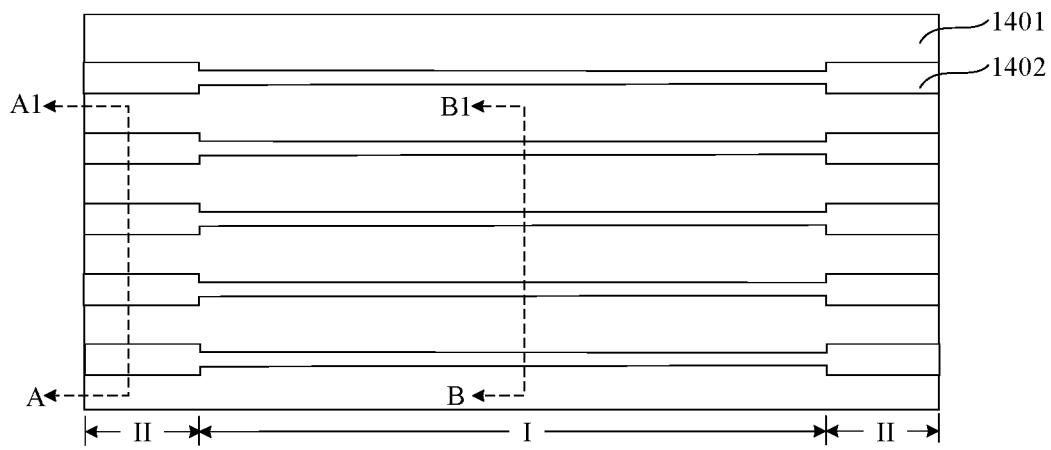
FIGS. 21 to 27 are schematic diagrams showing a structure of a cover plate provided in a fourteenth embodiment of the present disclosure.

With reference to FIG. 21 which is a schematic diagram showing a top-view structure of the cover plate, in this embodiment, a cover plate 1401 is configured to form a photovoltaic module with a cell string that includes a plurality of cells. Adjacent cells of the cells share an overlapped region, the cover plate 1401 has a first surface (not shown) facing the cell string and a second surface (not shown) opposite to the first surface, and the first surface includes a central region I and a peripheral region II located at an outer side of the central region I. The cover plate 1401 includes at least one groove 1402 extending from the first surface toward the second surface The at least one groove 1402 is located in the central region I and the peripheral region II and the groove 1402 faces at least one overlapped region. Herein, the groove 1402 facing each overlapped region in the peripheral region II has a first capacity, the groove 1402 facing each overlapped region located in the central region I has a second capacity, and the first capacity is larger than the second capacity.

In this embodiment, that the first surface is a rectangle is taken as an example, and the peripheral regions II are located at two opposite sides of the central region I. In other embodiments, a shape of the first surface may alternatively be a square or a circle, and the peripheral region surrounds the central region. For a detailed description about the first surface, the central region and the peripheral region, detailed description in the previous embodiment may be referred to.

The adjacent cells have a connecting line in the overlapped region. The capacity refers to a capacity of the groove 1402 within a length of the connecting line. The larger the capacity of the groove 1402, the larger quantity of the adhesive film flowing into the groove 1402 in a laminating stage, and the higher the ability of the groove 102 to remove pressure, and the more advantageous for reducing pressure on the overlapped region right facing the groove 1402. In other words, that the first capacity is larger than the second capacity practically is that: a cross section area of the groove 1402 in the peripheral region II is larger than a cross section area of the groove 1402 in the central region I in a direction parallel to an arrangement direction of the plurality of cells in one cell string, i.e., on a cross section perpendicular to the connecting line.

It is known from the above that in the laminating stage, the overlapped region in the peripheral region II is more prone to a risk of cracking than the overlapped region in the peripheral region I. In this embodiment, the grooves 1402 are both located in the peripheral region II and the central region I, and the groove 1402 in the peripheral region II is more capable in removing pressure than the groove 1402 in the central region I. The groove 1402 in the peripheral region II can avoid cracking of the overlapped region in the central region I while avoiding cracking of the overlapped region in the peripheral region II, which is advantageous for further improving yield of photovoltaic modules by using the cover plate 1401.

In this embodiment, a depth h of the groove 1402 in the peripheral region II is the same with a depth h of the groove 1402 in the central region I.

Figure 22:
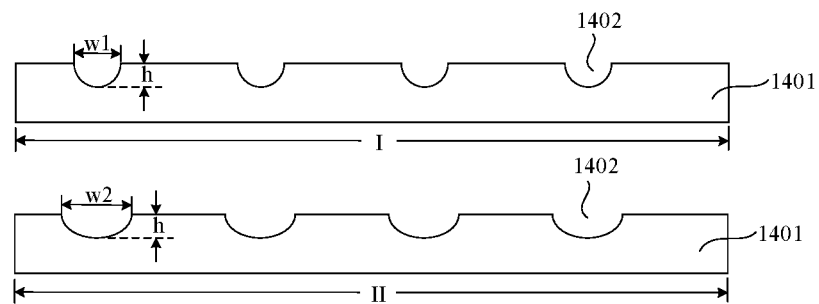

FIG. 22 is a schematic diagram showing a cross section structure along AA1 and BB1 in FIG. 21. As shown in FIG. 22, in one example, the adjacent cells have a connecting line in the overlapped region. In a cross section direction perpendicular to the connecting line, i.e., in a direction parallel to the arrangement direction of the plurality of cells in one cell string, a cross section shape of the groove 1402 in the peripheral region II may be identical with a cross section shape of the groove 1402 in the central region I. In the cross section direction (AA1) perpendicular to the connecting line, a cross section width of the groove 1402 in the peripheral region II is larger than a cross section width of the groove 1402 in the central region I.

Specifically, the cross section width of the groove 1402 in the central region I is a first width w1, the cross section width of the groove 1402 in the peripheral region II is a second width w2, and a difference value between the second width w2 and the first width w1 is larger than or equal to 2 mm and smaller than or equal to 5 mm, for example, w2 minus w1 is equal to 2.5 mm, 3 mm, 4.5 mm or 4 mm. In this way, a difference value between a width of the groove 1402 in the peripheral region II and a width of the groove 1402 in the central region I is medium, which not only enables a result of buffering pressure by the groove 1402 in the peripheral region II to be better than a result of buffering pressure by the groove 1402 in the central region I, but also prevents a capacity of the groove 1402 in the peripheral region II from being too large, thereby ensuring that the cover plate 1401 supports and protects the cells well.

Specifically, in the direction parallel to the arrangement direction of the plurality of cells in one cell string, the first width w1 is 3 mm to 15 mm, for example, 4 mm, 6 mm, 10 mm or 12 mm, and the second width w2 is 5 mm to 20 mm, for example, 6 mm, 10 mm, 15 mm or 18 mm.

Figure 23:
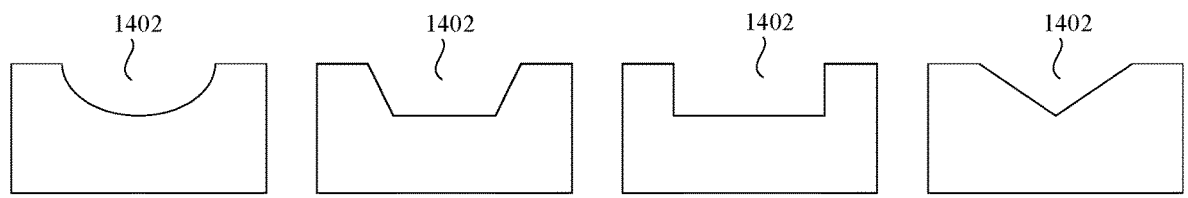

As shown in FIG. 23, in the direction parallel to the arrangement direction of the plurality of cells in one cell string, the cross section shape of the groove 1402 is an arc, an inverted trapezoid, a square or an inverted triangle.

Figure 24:
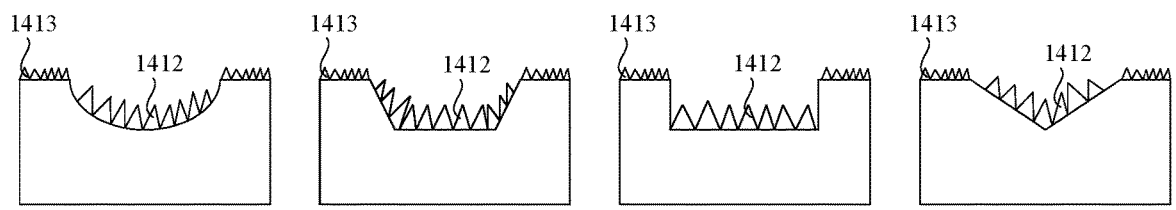

As shown in FIG. 24, the cover plate 1401 may further include a plurality of protruding structures 1412 located on a surface of the groove 1402 and a burring structure 1413 on the first surface. For details of the protruding structures 1412 and the burring structure 1413, the detailed description in the previous embodiment may be referred to and is not repeated herein.

Figure 25:
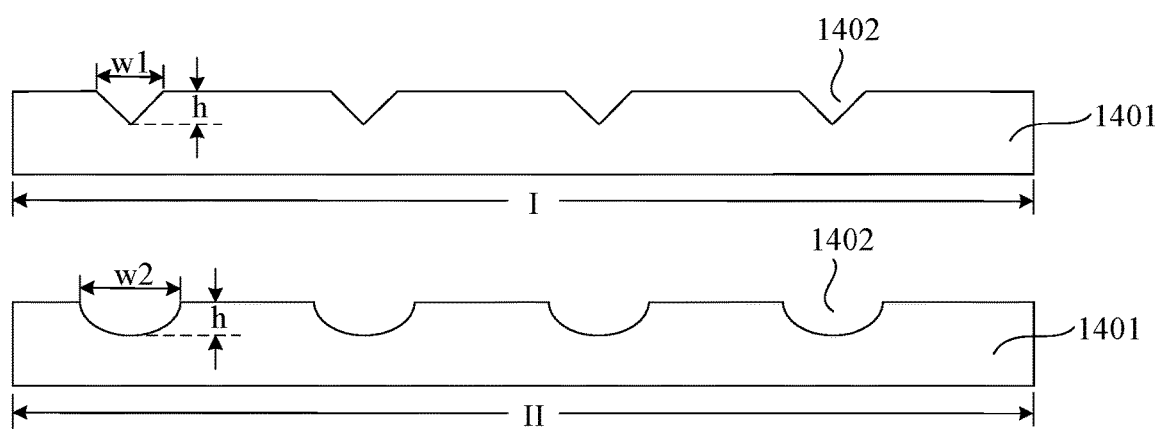

FIG. 25 is a schematic diagram showing another cross section structure along AA1 and BB1 in FIG. 21. As shown in FIG. 25, in another example, in the direction parallel to the arrangement direction of the plurality of cells in one cell string, the cross section shape of the groove 1402 in the peripheral region II may be different from the cross section shape of the groove 1402 in the central region I, and the depth h of the groove 1402 in the peripheral region II is identical with the depth h of the groove 1042 in the central region I. In the direction parallel to the arrangement direction of the plurality of cells in one cell string, the cross section width of the groove 1402 in the peripheral region II is larger than the cross section width of the groove 1402 in the central region I. Specifically, the cross section shape of the groove 14402 in the central region I may be an inverted triangle, and the cross section shape of the groove 1402 in the peripheral region II may be an arc.

It may be appreciated that no matter what shape, width or depth of the groove 102 in the peripheral region II and the central region I is set, it meets what is required as long as the capacity of the groove 1402 in the peripheral region II is larger than the capacity of the groove 1402 in the central region I, or as long as the cross section area of the groove 1402 in the peripheral region II is larger than the cross section area of the groove 1402 in the central region I. For example, in the direction parallel to the arrangement direction of the plurality of cells in one cell string, the cross section width of the groove 1402 in the peripheral region II is identical with the cross section width of the groove 1402 in the central region I, and their depth are identical. In the direction parallel to the arrangement direction of the plurality of cells in one cell string, the cross section shape of the groove 1402 in the peripheral region II is different from the cross section shape of the groove 1402 in the central region I. Alternatively, in the direction parallel to the arrangement direction of the plurality of cells in one cell string, the cross section width of the groove 1402 in the peripheral region II is larger than the cross section width of the groove 1402 in the central region I, and the depth of the groove 1402 in the peripheral region II is larger than the depth of the groove 1402 in the central region I.

Figure 26:
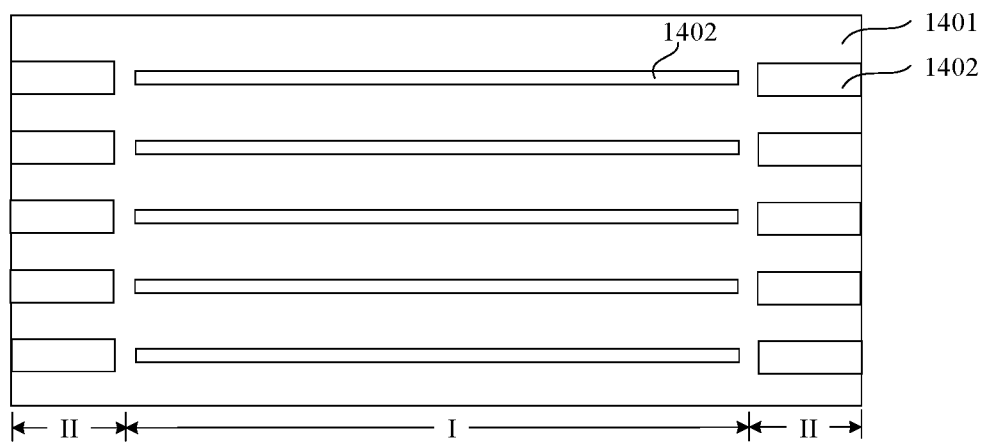

In one example, as shown in FIG. 21, one groove 102 crosses both the peripheral region II and the central region I. In another example, as shown in FIG. 26, the groove 1402 in the peripheral region II is separated from the groove 1402 in the central region I. Compared with a solution that the groove in the peripheral region and the groove in the central region are in connection, that the grooves 1402 in the peripheral region II and in the central region I are separated is advantageous for increasing mechanical strength of the cover plate 1401, thereby further increasing yield and reliability of the photovoltaic module.

Besides, as shown in FIG. 21 or FIG. 26, in a direction of a long side of the first surface, one groove 1402 in one peripheral region II may cross the peripheral region II.

Figure 27:
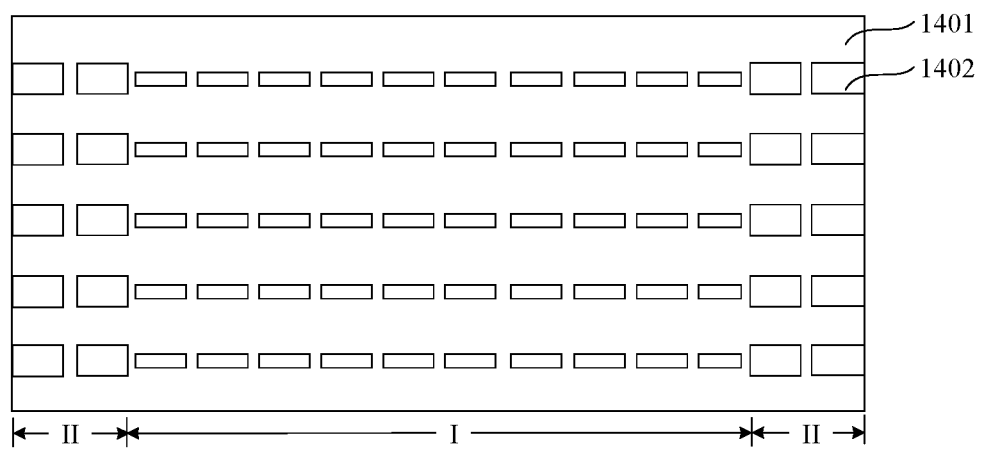

In another example, as shown in FIG. 27, in the direction along the long side of the first surface, one peripheral region II may alternatively be arranged with at least two mutually separated grooves 1402, and the central region I is arranged with a plurality of mutually separated grooves 1402. In the direction along the long side of the first surface, a distance between adjacent grooves 1402 matches a distance between cell strings forming the photovoltaic module. Since a plurality of grooves 1402 are separated from each other, different grooves 1402 located in the peripheral region II or in the central region I may be arranged with different sizes, which is advantageous for matching cell strings of different sizes and improving structural flexibility of the photovoltaic module. In addition, compared with the solution that adjacent grooves are in connection, in the extending direction of the connecting line, there is a material of the cover plate 1401 between the adjacent grooves 1402, and the material can improve mechanical strength of the cover plate 1401 while thickness of the cover plate 1401 keeps unchanged, thereby further improving the yield and reliability of the photovoltaic modules.

In a producing stage, the cover plate 1401 having the groove 1402 may be manufactured through a calender roll having protruding structures arranged in a periodical manner.

In the cover plate 1401 in this embodiment, the groove 1402 is located not only in the peripheral region II but also in the central region I, and the capacity of the groove 1402 in the peripheral region II is larger than the capacity of the groove 1402 in the central region I. In this way, not only a pressure on the overlapped region in the central region I and a pressure on the overlapped region in the peripheral region II can be reduced, but it may be ensured that the cover plate 1401 has sufficient strength to prevent the cover plate 1401 from the risk of fragmenting, thereby further improving yield and service life of the photovoltaic module.

If a size of the groove in the central region is identical with that in the peripheral region, a total capacity of the groove in the cover plate is large, which makes strength of the cover plate low. In this way, when the cover plate is used for lamination, the cover plate is prone to crack, affecting the yield of the photovoltaic module. Besides, during using the photovoltaic module, the cover plate is also prone to crack, affecting the service life of the photovoltaic modules.

A fifteen embodiment of the present disclosure further provides a cover plate. The cover plate in this embodiment is described in detail in the following with reference to the drawings. Contents identical with the previous embodiment may be seen in the above and is not repeated in the following.

Figure 28:
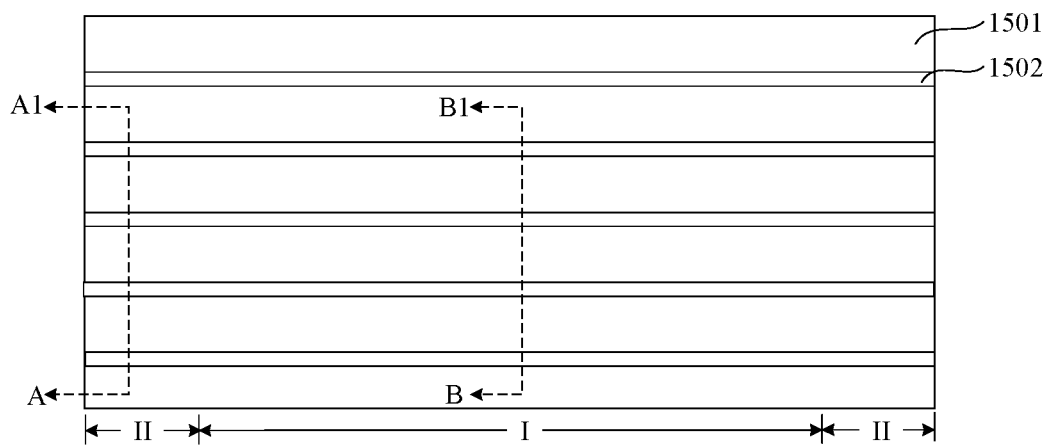
FIGS. 28 to 30 are schematic diagrams showing a structure of a cover plate provided in a fifteenth embodiment of the present disclosure.
Figure 29:
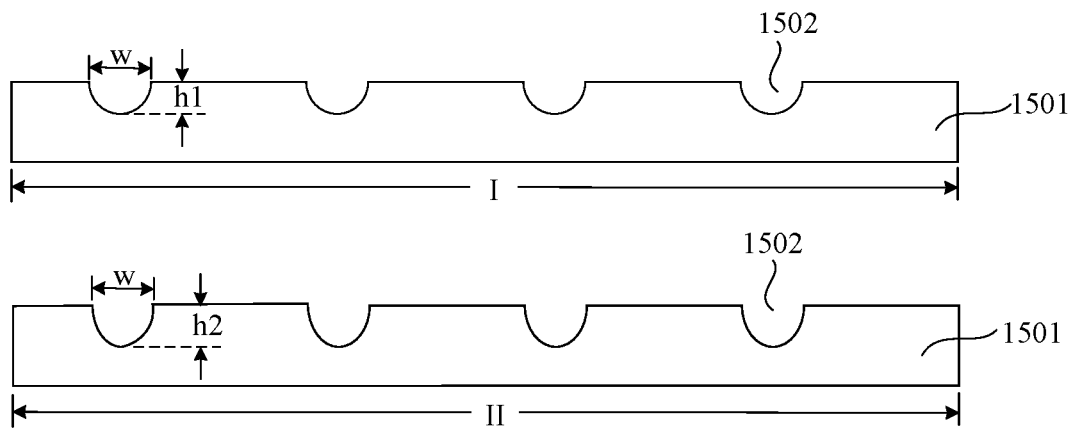
Figure 30:
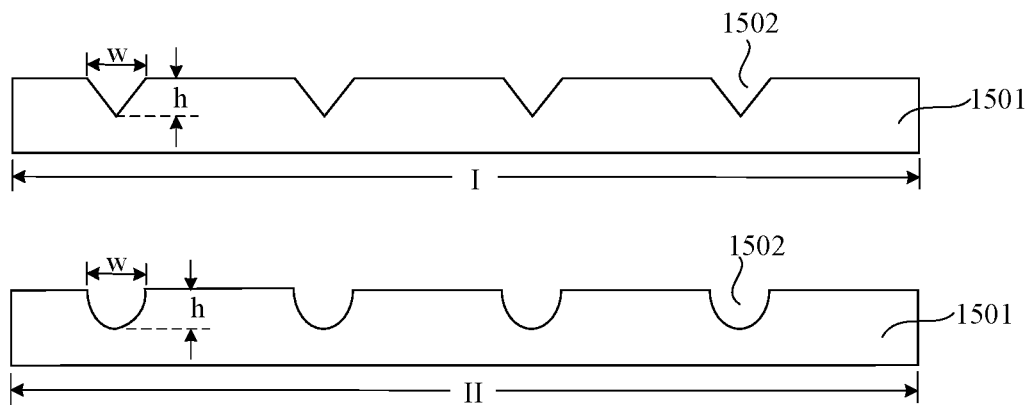

FIGS. 28 to 30 are schematic diagrams showing a structure of the cover plate in the fifteen embodiment of the present disclosure.

With reference to FIG. 28 to FIG. 30, FIG. 28 is a schematic top-view structure of the cover plate. A cover plate 1501 includes a first surface and a second surface and includes a central region I and peripheral regions II, a groove 1502 extending from the first surface toward the second surface. Each groove 1502 is located in the central region I and the peripheral region II, and the groove 1502 faces at least one overlapped region. Herein, the groove 1502 facing each overlapped region located in the peripheral region II has a first capacity, the groove 1502 facing each overlapped region located in the central region I has a second capacity, and the first capacity is larger than the second capacity.

Specifically, the cover plate 1501 is used to form a photovoltaic module with the cell string, the adjacent cells in the cell string have a connecting line in the overlapped region, and an extending direction of the connecting line is perpendicular to a direction of AA1. In a direction perpendicular to the connecting line, that is, in a direction parallel to the arrangement direction of the multiple cells in one battery string, a cross section area of the groove 1502 in the peripheral region II is larger than the cross section area of the groove 1502 in the central region I.

In this embodiment, in the direction parallel to the arrangement direction of the plurality of cells in one cell string, a cross section width w of the groove 1502 in the peripheral region II is identical with a cross section width w of the groove 1502 in the central region I.

In one example, as shown in FIG. 29, FIG. 29 is a schematic diagram showing a cross section structure along AA1 and BB1 in FIG. 28, a depth of the groove 1502 in the peripheral region II being larger than a depth of the groove 1502 in the central region I. Specifically, the depth of the groove 1502 in the central region I is a first depth h1, the depth of the groove 1502 in the peripheral region II is a second depth h2, and the second depth h2 is larger than the first depth h1. Herein, in the direction parallel to the arrangement direction of the plurality of cells in one cell string, a cross section shape of the groove 1502 in the central region I is identical with a cross section shape of the groove 1502 in the peripheral region II.

In other embodiments, in a direction parallel to an arrangement direction of a plurality of cells in one cell string, a cross section shape of a groove in a central region may further be different from a cross section shape of a groove in a peripheral region. In this way, even if cross section depths and/or widths of the groove in the central region and in the peripheral region are identical, it may be ensured that a cross section area of the groove in the peripheral region is larger than a cross section area of the groove in the central region in the direction parallel to the arrangement direction of the plurality of cells in one cell string by setting different shapes for the groove in the central region and in the peripheral region.

FIG. 30 is a schematic diagram showing another cross section structure along AA1 and BB1 in FIG. 28. As shown in FIG. 30, in another example, a depth h of the groove 1502 in the peripheral region II is identical with a depth h of the groove 1502 in the central region I, and in the direction parallel to the arrangement direction of the plurality of cells in one cell string, the cross section width w of the groove 1502 in the peripheral region II may further be identical with the cross section width w of the groove 1502 in the central region I. Herein, in the direction parallel to the arrangement direction of the plurality of cells in one cell string, the cross section shape of the groove 1502 in the peripheral region II may be different from the cross section shape of the groove 1502 in the central region I. Specifically, the cross section shape of the groove 1502 in the central region I may be an inverted triangle, and the cross section shape of the groove 1502 in the peripheral region II may be an arc.

A sixteen embodiment of the present disclosure further provides a cover plate which is generally identical with the cover plate in the previous embodiment. The cover plate is mainly different in that the extending direction of the groove is the extending direction of a short side of the first surface. The cover plate in the sixteen embodiment is described in detail in the following with reference to the drawings. Contents identical with the previous embodiment may be seen in the above and is not repeated in the following.

Figure 31:
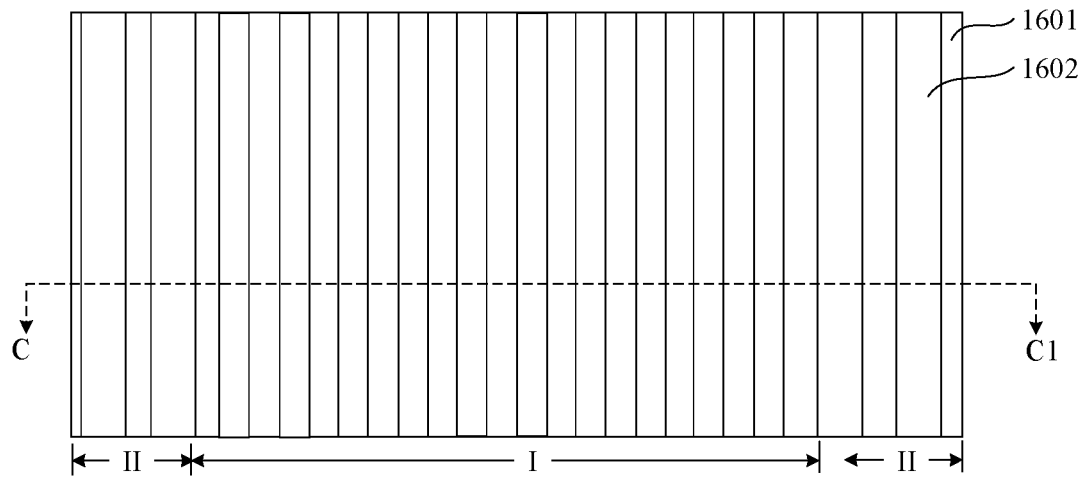
FIGS. 31 to 33 are schematic diagrams showing a structure of a cover plate provided in a sixteenth embodiment of the present disclosure.
Figure 32:
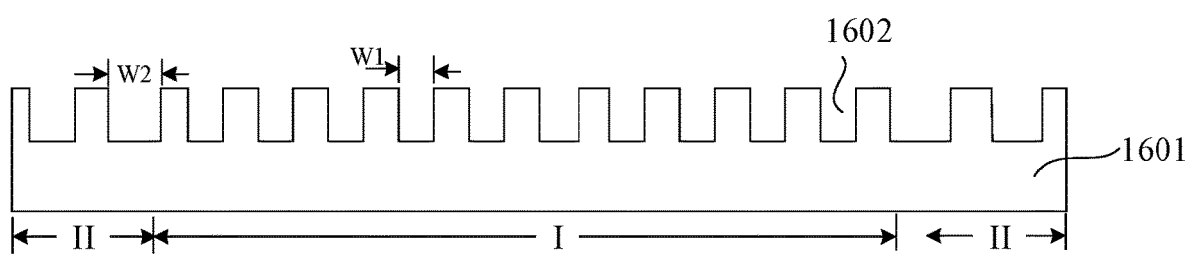
Figure 33:
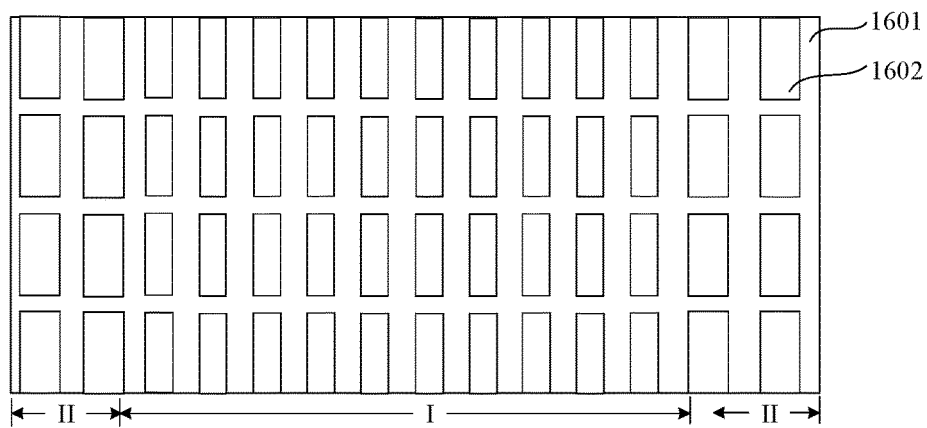

FIGS. 31 to 33 are schematic diagrams showing a structure of the cover plate in the fourth embodiment of the present disclosure. FIG. 31 is a schematic top-view structure, FIG. 32 is a schematic cross-sectional-view structure along CC1 in FIG. 31, and FIG. 33 is another schematic top-view structure.

With reference to FIG. 31 and FIG. 32, in this embodiment, a cover plate 1601 includes a groove 1602 that extends from a first surface to a second surface, the first surface includes a central region I and a peripheral region II, and each groove 1602 is located in the central region I and the peripheral region II. The groove facing each overlapped region located in the peripheral region has a first capacity, the groove facing each overlapped region located in the central region has a second capacity, and the first capacity is larger than the second capacity.

In this embodiment, the first surface is a rectangle, and the extending direction of the same groove 1602 is identical with an extending direction of the extending direction of the short side of the first surface.

An overlapped region of adjacent cells in one cell string has a connecting line, and an extending direction of the connecting line is perpendicular to a direction of CC1, that is, the extending direction of the connecting line is identical with the extending direction of the short side of the first surface, and the adjacent cells are arranged along a long side of the first surface. The extending direction of the connecting line is perpendicular to an arrangement direction of a plurality of cells in one cell string.

In this embodiment, in a direction parallel to an arrangement direction of the plurality of cells in one cell string, a cross section area of the groove 1602 in the peripheral region II is larger than a cross section area of the groove 1602 in the central region I.

In one example, a depth of the groove 1602 in the central region I is identical with a depth of the groove 1602 in the peripheral region II, and in the direction parallel to the arrangement direction of the plurality of cells in one cell string, a cross section width of the groove 1602 in the peripheral region II is larger than a cross section width of the groove 1602 in the central region I. Specifically, the groove 1602 in the central region I has a first width W1, the groove 1602 in the peripheral region II has a second width W2, and the second width W2 is larger than the first width W1. Herein, a cross section shape of the groove 1602 in the central region I may be identical with the cross section of the groove 1602 in the peripheral region II, for example, both are rectangles; the cross section shape of the groove 1602 in the central region I may alternatively be different from the cross section of the groove 1602 in the peripheral region II.

In another example, a depth of the groove 1602 in the central region I is smaller than a depth of the groove 1602 in the peripheral region II, and in the direction parallel to the arrangement direction of the plurality of cells in one cell string, a cross section width of the groove 1602 in the peripheral region II is equal to a cross section width of the groove 1602 in the central region I. Alternatively, the depth of the groove 1602 in the central region I is smaller than the depth of the groove 1602 in the peripheral region II, and in the direction parallel to the arrangement direction of the plurality of cells in one cell string, a cross section width of the groove 1602 in the peripheral region II is smaller than a cross section width of the groove 1602 in the central region I.

As shown in FIG. 31, one groove 1602 in the peripheral region II crosses the short side of the first surface, and one groove 1602 in the central region I crosses the short side of the first surface. In other embodiments, as shown in FIG. 33, a plurality of separate grooves 1602 are arranged in an extending direction of the short side of the first surface. The number of grooves extending in the direction of short side of the first surface may be reasonably set in accordance with a type of the cell string of the photovoltaic module.

Figure 34:
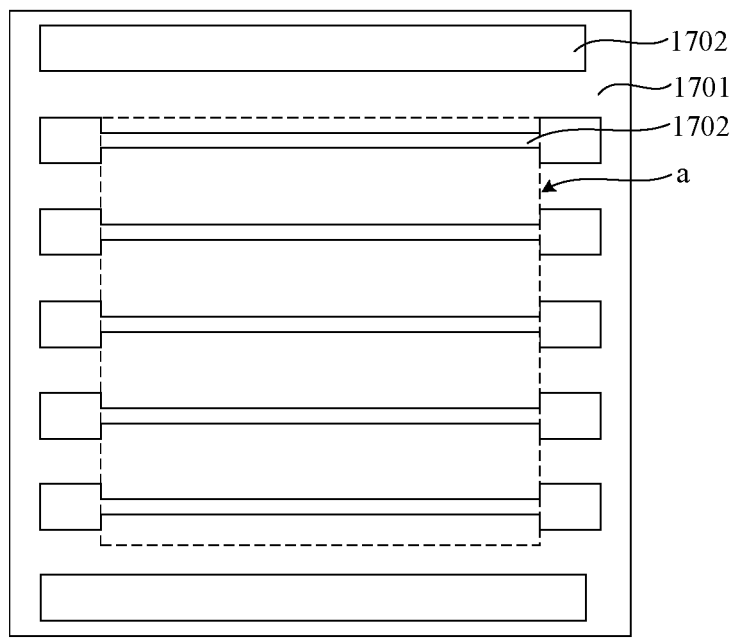
FIG. 34 is a schematic diagram showing a top-view structure of a cover plate provided in a seventeenth embodiment of the present disclosure.

A seventeen embodiment of the present disclosure further provides a cover plate which is generally identical with that in the previous embodiment, and a main difference lies in that the peripheral region surrounds the central region. FIG. 34 is a schematic top-view structure of the cover plate in the seventeen embodiment.

With reference to FIG. 34, a cover plate 1701 has a first surface and a second surface, and the first surface has a central region and a peripheral region that surrounds the central region. Herein, a region within dotted lines a is the central region, and a region outside dotted lines a is the peripheral region. The cover plate 1701 includes a groove 1702 extending from the first surface toward the second surface, and the groove 1702 is located in the central region and the peripheral region. Herein, the groove right facing each overlapped region in the peripheral region has a first capacity, the groove right facing each overlapped region located in the central region has a second capacity, and the first capacity is larger than the second capacity.

Detailed description about the first capacity and second capacity may be seen in the previous embodiments and is not repeated herein.

In this embodiment, there is a connecting line in an overlapped region of the cell string, and in a cross-section direction perpendicular to the connecting line, i.e., in a direction parallel to an arrangement direction of a plurality of cells in one cell string, a cross section width of the groove 1702 in the peripheral region is larger than a cross section width of the groove 1702 in the central region. In other embodiments, a cross section width of the groove in the peripheral region may alternatively be equal to a cross section width of the groove in the central region.

For a size relationship between the grooves in the peripheral region and in the central region, the description in the previous embodiments may be referred to. It meets what is required as long as a cross section area of the groove in the peripheral region is larger than a cross section area of the groove in the central region in a cross section direction perpendicular to the connecting line.

Figure 35:
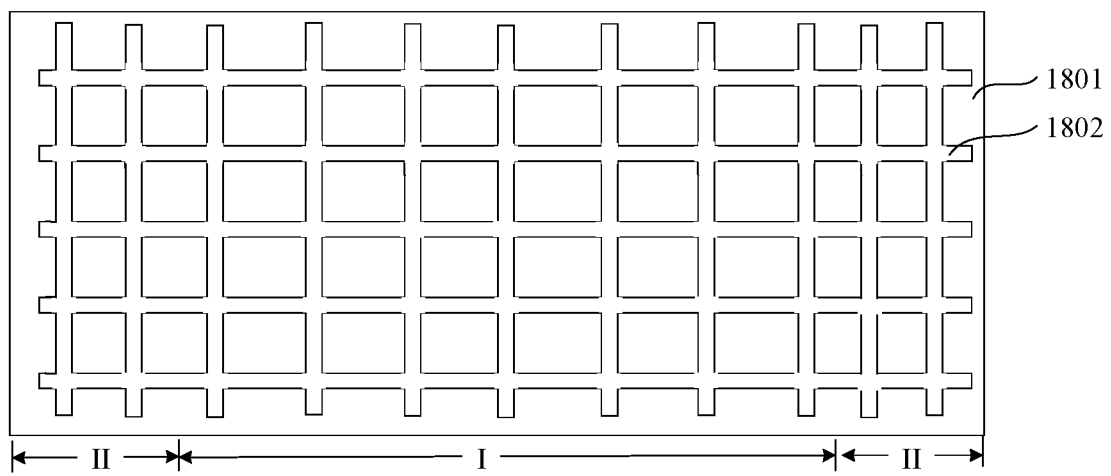
FIG. 35 is a schematic diagram showing a top-view structure of a cover plate provided in a eighteenth embodiment of the present disclosure.

An eighteen embodiment of the present disclosure provides a cover plate, which is generally the same with the previous embodiment, and a main difference lies in including that a groove in the cover plate includes both a groove extending horizontally and a groove extending vertically. FIG. 35 is a schematic top-view structure of the cover plate in the eighteenth embodiment. The cover plate in this embodiment is described with reference to the drawings. Contents identical with the previous embodiment may be seen in the above.

With reference to FIG. 35, a cover plate 1801 includes a central region I and a peripheral region II, and the cover plate 1801 has grooves 1802 extending from a first surface to a second surface. The grooves 1802 includes a plurality of grooves 1802 extending along a long side of the first surface and a plurality of grooves 1802 extending along a short side of the first surface.

For the plurality of grooves 1802 extending in one extending direction, the groove 1802 facing each overlapped region located in the peripheral region II has a first capacity, the groove 1802 facing each overlapped region located in the central region I has a second capacity, and the first capacity is larger than the second capacity. Specifically, for the plurality of grooves 1802 extending in one direction, there is a connecting line in an overlapped region of the cell string. In a cross section direction perpendicular to the connecting line, a cross section area of the groove 1802 in the peripheral region II is larger than a cross section area of the groove 1802 in the central region.

The cover plate 1801 in this embodiment may form a photovoltaic module with both a cell string where cells are arranged horizontally and a cell string where cells are arranged vertically, and at the same time, may prevent cracking or fragmenting of the overlapped region in the central region I and the peripheral region II.

An embodiment of the present disclosure further provides a photovoltaic module, including: a functional part, in any one of the above embodiments, where the functional part is a cover plate; a cell string, including a plurality of cells, where adjacent cells of the cells share an overlapped region and the groove faces at least one overlapped region; and an adhesive film, located between the cover plate and the cell string, and in the groove. The photovoltaic module may be a single-glass module or a double-glass module.

Figure 36:
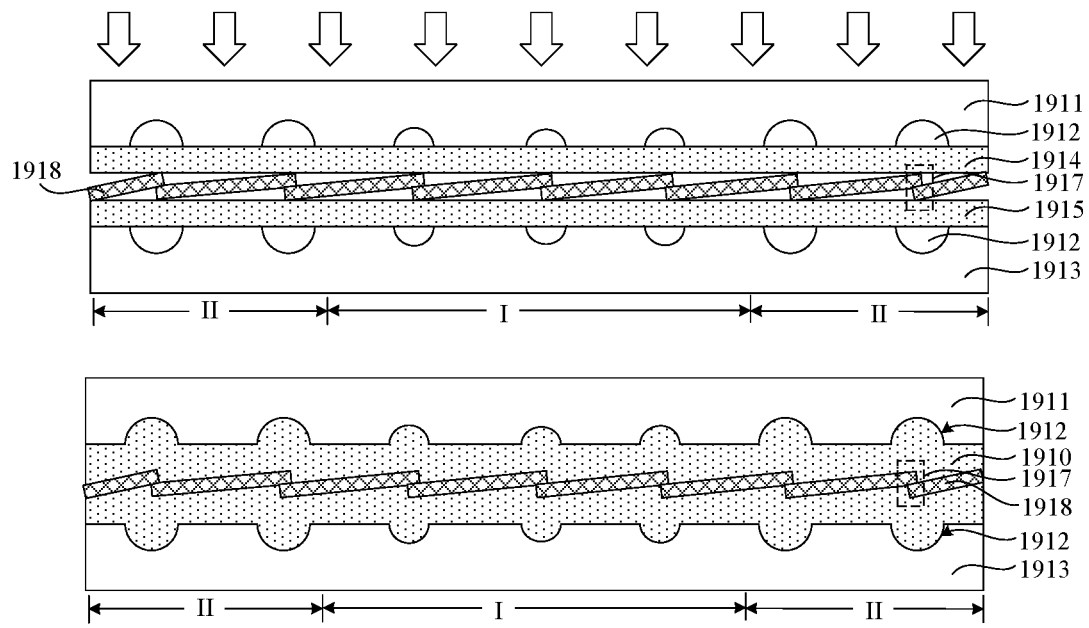
FIG. 36 is a schematic diagram showing a cross-section-view structure of a photovoltaic module provided in a nineteenth embodiment of the present disclosure.

FIG. 36 is a schematic diagram showing a cross-sectional-view structure of a photovoltaic module in a nineteen embodiment of the present disclosure. Herein, in FIG. 36, the upper figure is a schematic diagram showing a cross-sectional-view structure of the photovoltaic module after a stacking-up stage, and the lower figure is a schematic diagram showing a cross-sectional-view structure of the photovoltaic module after a laminating stage. The big arrows show a direction of pressure in the laminating stage.

With reference to FIG. 36, the cover plate includes a back plate 1911 and a transparent front plate 1913, and includes a central region I and peripheral regions II located at an outer side of the central region I. The back plate 1911 and the transparent front plate 1913 are separately located at two opposite sides of the cell string. The cell string includes a plurality of cells 1918. Adjacent cells 1918 share an overlapped region 1917. Each overlapped region 1917 in the peripheral region II faces the groove 1912 in the back plate 11 and the groove 1912 in the transparent front plate 1913.

The overlapped region 1917 may be arranged with a welding ribbon. Electrical connection between the adjacent cells 1918 is realized through the welding ribbon.

In this embodiment, the central region I is also arranged with grooves 1912. In other embodiments, the central region is not arranged with a groove.

In this embodiment, the groove 1912 in the back plate 1911 and the groove 1912 in the transparent front plate 1913 face each other in terms of location, so that each overlapped region 1917 corresponds to two grooves in terms of location.

The photovoltaic module may be a single-glass module, and a transparent front plate 1913 may be a glass cover plate. The back plate 1911 may be a polymer cover plate or a stainless steel cover plate. The photovoltaic module may further be a double-glass module, and both the transparent front plate 1913 and the back plate 1911 are glass cover plates.

The photovoltaic module further includes: an adhesive film 1910 located among the back plate 1911, the cell string and the transparent front plate 1913, and the adhesive film also fills the groove 1912. Herein, the adhesive film may fill the whole or part of the groove 1912.

A result of this embodiment is described with reference to a manufacturing process of the photovoltaic module in the following: in the stacking-up stage, a transparent front plate 1913, a first adhesive film 1915, a cell string, a second adhesive film 1914 and a back plate 1911 are stacked in sequence to form a stacked structure. An air extracting process is performed to remove air in the overlapped structure. Before a laminating stage, the overlapped structure in the peripheral region II warps upwards relative to the central region I, and in the laminating stage, a pressure is applied to the back plate 1911 and the stacked structure is heated to melt and mix the first adhesive film 15 and the second adhesive film 1914 to fill the grooves 1912 to form the adhesive film 1910. The grooves 1912 in the peripheral region II may buffer a pressure from the back plate 1911 on the overlapped region to reduce the pressure on the overlapped region, thereby reducing a risk of cracking of the overlapped region 1917. Further, melted adhesive film fills the grooves 1912 in the transparent front plate 1913, which is advantageous for further reducing the pressure on the overlapped region and further reducing the risk of cracking and fragmenting of the overlapped region in the peripheral region II. Similarly, a pressure on the overlapped region in the central region I is also reduced.

Compared with a solution that the grooves in the central region and in the peripheral region have an equal capacity, the capacity of the groove 1912 in the central region I is smaller than the capacity of the groove 1912 in the peripheral region II, which is advantageous for ensuring that the cover plate has high strength. In this way, while fragmenting of the overlapped region in the peripheral region II and in the central region I is prevented, the cover plate is prevented from being damaged. Besides, since both the cover plate, i.e., the cover plate 1911, and the transparent front plate 1913 have a high strength, it ensures that during using the photovoltaic module, the cover plate has a high strength, thereby improving service life of the photovoltaic module.

In addition, a contact area between the cover plate (the back plate 1911 and the transparent front plate 1913) and the adhesive film 1910 is increased, which is advantageous for improving adhesion between the cover plate and the adhesive film 1910 and improving reliability of the photovoltaic module.

Another embodiment of the present disclosure provides a photovoltaic module which is generally identical with that in the previous embodiment, and a difference lies in that the cover plate is one of the back plate and the transparent front plate. The photovoltaic module in this embodiment is described in detail in the following with reference to the drawings.

Figure 37:
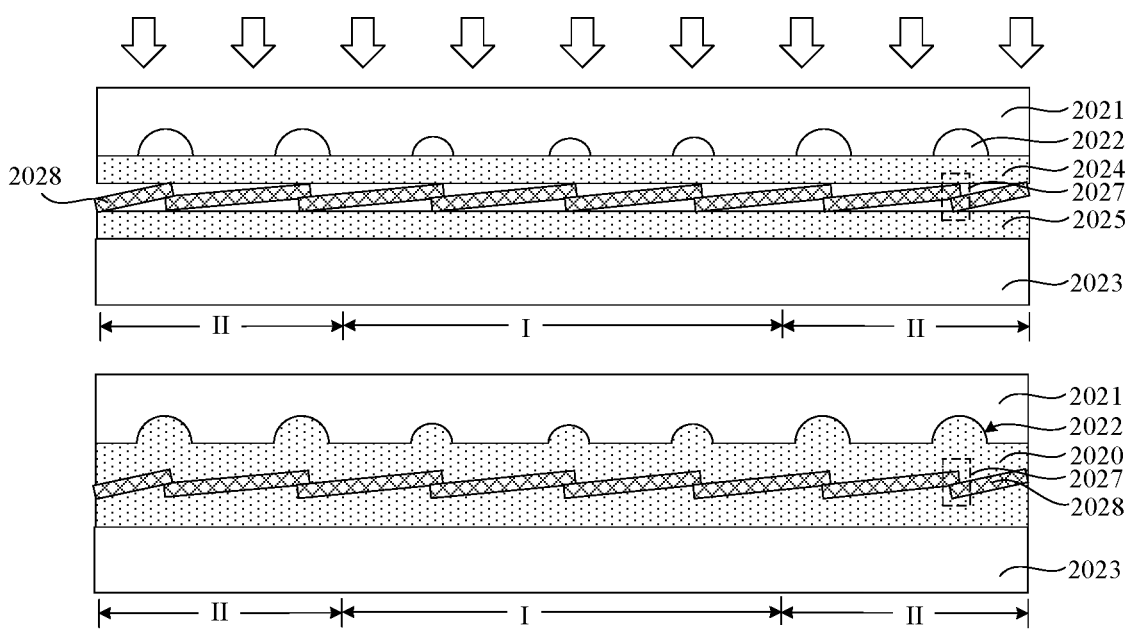
FIG. 37 is a schematic diagram showing a cross-section-view structure of a photovoltaic module provided in a twentieth embodiment of the present disclosure.

FIG. 37 is a schematic diagram showing a cross-sectional-view structure of a photovoltaic module in a twenty embodiment of the present disclosure. In FIG. 37, the upper figure is a schematic diagram showing a cross-sectional-view structure of the photovoltaic module after an overlapping stage, and the lower figure is a schematic diagram showing a cross-sectional-view structure of the photovoltaic module after a laminating stage.

With reference to FIG. 37, the photovoltaic module includes: a cover plate, which is a back plate 2021 that includes a central region I and peripheral regions II, where the peripheral region II of the back plate 2021 is arranged with grooves 2022; a cell string, including a plurality of cells 2018, where adjacent cells 28 share an overlapped region 2027 and each overlapped region 2027 in the peripheral region II corresponds to a groove 2022 in the back plate 2021; a transparent front plate 2023 located at one side of the cell string, where the side is away from the back plate 2021; and an adhesive film 20, located between the back plate 2021 and the transparent front plate 2023, and filling the groove 2022.

The photovoltaic module may be a single-glass module or a double-glass module.

In other embodiments, the cover plate may alternatively be a transparent front plate, a groove is arranged in the transparent front plate, and the photovoltaic module further includes a back plate located at one side of the cell string, where the side is away from the transparent front plate.

In the stacking-up stage, a transparent front plate 2023, a first adhesive film 2025, a cell string, a second adhesive film 2024 and a back plate 2021 are stacked in sequence to form a stacked structure.

In this embodiment, the grooves 2022 are only located in the transparent front plate or in the back plate, which further improves strength of the whole photovoltaic module while reducing a pressure on the overlapped region in the peripheral region II and central region I. Therefore, while yield of manufacturing the photovoltaic module is increased, it is also advantageous for improving service life of the photovoltaic module.

Figure 38:
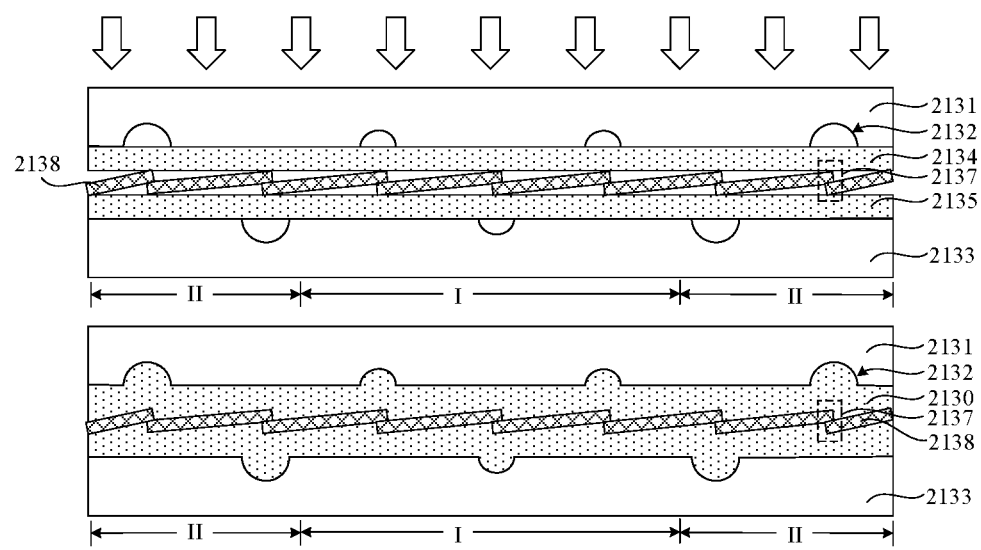
FIG. 38 is a schematic diagram showing a cross-section-view structure of a photovoltaic module provided in a twenty-first embodiment of the present disclosure.

A twenty-one embodiment of the present disclosure further provides a photovoltaic module. FIG. 38 is a schematic diagram showing a cross-sectional-view structure of the photovoltaic module in the twenty-one embodiment of the present disclosure. In FIG. 38, the upper figure is a schematic diagram showing a cross-sectional-view structure of the photovoltaic module after a stacked stage, and the lower figure is a schematic diagram showing a cross-sectional-view structure of the photovoltaic module after a laminating stage.

With reference to FIG. 38, the photovoltaic module includes: cover plates, including a central region I and a peripheral region II, where the cover plates includes a back plate 2131 and a transparent front plate 2133 that are separately located at two opposite sides of a cell string; the cell string, including a plurality of cells 2138, where the adjacent cells 2138 shares an overlapped region 2137 and each overlapped region 2137 faces a groove 2132 in the back pate 2131 or a groove 2132 in the transparent front plate 2133; an adhesive film 2130, located between the back pate 2131 and the transparent front plate 2133, and filling the groove 2132.

The photovoltaic module may be a single-glass module or a double-glass module.

In this embodiment, the groove 2132 in the back plate 2131 and the groove 2132 in the transparent front plate 2133 are staggered in terms of location, so that each overlapped region 2137 faces only one groove 2132. In one example, both the transparent front plate 2133 and the back plate 2131 in the peripheral region II have at least one groove 2132. In another example, one of the transparent front plate 2133 and the back plate 2131 in the peripheral region II is arranged with a groove 2132, while the other is not arranged with a groove.

In the stacking-up stage, a transparent front plate 2133, a first adhesive film 2135, a cell string, a second adhesive film 2134 and a back plate 2131 are stacked in sequence to form a stacked structure. In a laminating stage, the grooves 2132 in the peripheral region II and the central region I may remove pressure, and the groove 2132 in the peripheral region II has a stronger ability in removing pressure than the groove 2132 in the central region I, thereby preventing cracking or fragmenting of the overlapped region 2137 in the central region I while avoiding cracking or fragmenting of the overlapped region 2137 in the peripheral region II.

Besides, since each overlapped region 2137 faces one groove 32, the number of grooves 2132 in the back plate 2131 and in the transparent front plate 2133 are reduced, which is advantageous for improving strength of the back plate 2131 and the transparent front plate 2133, thereby further improving service life of the photovoltaic module.

Those of ordinary skill in the art can understand that the above-mentioned embodiments are specific examples for implementing the present disclosure. In practice, various changes can be made in form and details without departing from the spirit and scope of the present disclosure. Any person skilled in the art can make changes and amendments without departing from the spirit and scope of the present disclosure. Therefore, the protection scope of the present disclosure should be subject to the scope defined by the Claims.

What is claimed is:

1. A functional part, configured to form a photovoltaic module with a cell string including a plurality of cells, adjacent cells of the plurality of cells sharing an overlapped region, the functional part comprising:
   a first adhesive film and a second adhesive film, each of the first and second adhesive films comprising:
   a first surface to face the cell string;
   a second surface opposite to the first surface; and
   at least one groove extending depth-wise from the first surface toward the second surface, a position of each of the at least one groove corresponding to a position of at least one overlapped region;
   wherein the first surface includes a central region and a peripheral region at an outer side of the central region;
   wherein a portion of the at least one groove is in the peripheral region, another portion of the at least one groove is in the central region, and the portion of the at least one groove in the peripheral region is separated from another portion of the at least one groove in the central region;
   wherein each groove facing a respective overlapped region in the peripheral region has a first capacity, each groove facing a respective overlapped region in the central region has a second capacity, and the first capacity is larger than the second capacity; and
   wherein the at least one groove in the first adhesive film and the at least one groove in the second adhesive film are staggered in terms of position, and each of the at least one groove in the first adhesive film and the at least one groove in the second adhesive film crosses a plurality of overlapped regions.

2. The functional part in accordance with claim 1, wherein the adjacent cells have a connecting line in the overlapped region, and a length direction of the at least one groove is identical with an extending direction of the connecting line.

3. The functional part in accordance with claim 1,
   wherein in a direction parallel to an arrangement direction of the plurality of cells in one cell string, a cross section area of the at least one groove in the peripheral region is larger than a cross section area of the at least one groove in the central region, wherein a depth of the at least one groove in the peripheral region is larger than a depth of the at least one groove in the central region; or in a direction parallel to an arrangement direction of the plurality of cells in one cell string, a cross section width of the at least one groove in the peripheral region is larger than a cross section width of the at least one groove in the central region.

4. The functional part in accordance with claim 1, wherein in the direction parallel to the arrangement direction of the plurality of cells in one cell string, a cross section shape of the at least one groove in the peripheral region is different from a cross section shape of the at least one groove in the central region;

wherein the first surface has a rectangle shape, both the central region and the peripheral region cross a short side of the first surface; or the first surface has a square shape or a circle shape, and the peripheral region surrounds the central region.

5. A photovoltaic module, comprising: a first adhesive film and a second adhesive film, the first adhesive film and the second adhesive film being functional parts configured to form the photovoltaic module with a cell string, the cell string including a plurality of cells, adjacent cells of the plurality of cells sharing an overlapped region, wherein each of the functional parts comprises:

a first surface to face the cell string;

a second surface opposite to the first surface;

at least one groove extending depth-wise from the first surface toward the second surface, and a position of each of the at least one groove corresponding to a position of at least one overlapped region;

wherein the first surface includes a central region and a peripheral region located at an outer side of the central region;

wherein a portion of the at least one groove is in the peripheral region, another portion of the at least one groove is in the central region, and the portion of the at least one groove in the peripheral region is separated from the another portion of the at least one groove in the central region, wherein each groove facing a respective overlapped region in the peripheral region has a first capacity, each groove facing a respective overlapped region in the central region has a second capacity, and the first capacity is larger than the second capacity; and wherein the at least one groove in the first adhesive film and at least one groove in the second adhesive film are staggered in terms of position.

6. A method for manufacturing a photovoltaic module, comprising:

stacking up, a first cover plate, a first adhesive film, a cell string, a second adhesive film and a second cover plate in sequence, both of the first adhesive film and the second adhesive film being the first adhesive film and the second adhesive film in accordance with claim 1;

laminating, the first cover plate, the first adhesive film, the cell string, the second adhesive film and the second cover plate, to form a laminated photovoltaic module;

wherein in a stacking-up process, the at least one groove in the first adhesive film and the at least one groove in the second adhesive film are staggered in terms of position.

7. The method in accordance with claim 6, wherein in a laminating process, a surface of the second cover plate is pressed, the surface being away from the second adhesive film.

8. The method in accordance with claim 6, wherein one or both of the first adhesive film having the at least one groove and the second adhesive film having the at least one groove are manufactured through a calender roll having a protruding structure.

9. The functional part in accordance with claim 1, wherein a depth of the at least one groove is smaller than or equal to half a thickness of the functional part.

10. The functional part in accordance with claim 1, further comprising a plurality of protruding structures on a surface of the at least one groove.

11. The photovoltaic module in accordance with claim 5, further comprising:

a first cover plate and a second cover plate, the first cover plate and the second cover plate being separately located at two opposite sides of the cell string.

* * * * *